(12) United States Patent
Tanigawa et al.

(10) Patent No.: US 9,423,109 B2
(45) Date of Patent: Aug. 23, 2016

(54) DISPLAY MODULE, DISPLAY APPARATUS, AND MANUFACTURING METHODS THEREOF

(71) Applicant: Oki Data Corporation, Tokyo (JP)

(72) Inventors: Ken-ichi Tanigawa, Gunma (JP); Takahito Suzuki, Gunma (JP)

(73) Assignee: Oki Data Corporation, Tokyo (JP)

( * ) Notice: Subject to any disclaimer, the term of this patent is extended or adjusted under 35 U.S.C. 154(b) by 838 days.

(21) Appl. No.: 13/753,962

(22) Filed: Jan. 30, 2013

(65) Prior Publication Data
US 2013/0194550 A1  Aug. 1, 2013

(30) Foreign Application Priority Data

Jan. 31, 2012 (JP) .................... 2012-018512

(51) Int. Cl.
| | |
|---|---|
| H01J 17/48 | (2006.01) |
| F21V 21/00 | (2006.01) |
| G03B 21/14 | (2006.01) |
| G09F 9/00 | (2006.01) |
| H01L 51/52 | (2006.01) |
| H01L 27/32 | (2006.01) |
| H01L 33/54 | (2010.01) |

(52) U.S. Cl.
CPC ............... *F21V 21/00* (2013.01); *G03B 21/14* (2013.01); *G09F 9/00* (2013.01); *H01L 51/5253* (2013.01); *H01L 27/3288* (2013.01); *H01L 33/54* (2013.01); *H01L 2251/566* (2013.01); *H01L 2924/0002* (2013.01)

(58) Field of Classification Search
CPC ................. H01L 2924/0002; H01L 2924/00; H01L 27/3244
USPC .................................. 313/489, 506, 512, 486
See application file for complete search history.

(56) References Cited

FOREIGN PATENT DOCUMENTS

| | | |
|---|---|---|
| JP | 2000030858 A | 1/2000 |
| JP | 2003243161 A | 8/2003 |
| JP | 2004119219 A | 4/2004 |
| JP | 2004517347 A | 6/2004 |
| JP | 2004319103 A | 11/2004 |
| JP | 2006146221 A | 6/2006 |
| JP | 2008165251 A | 7/2008 |
| JP | 2010-199176 A | 9/2010 |
| WO | 2011121662 A | 10/2011 |

*Primary Examiner* — Vip Patel
(74) *Attorney, Agent, or Firm* — Muncy, Geissler, Olds & Lowe, P.C.

(57) ABSTRACT

A display module includes a substrate, a plurality of light emitting elements provided on the substrate, a bank provided on the substrate at a position separated by a predetermined distance from an outer circumferential edge of a display region on which the plurality of light emitting elements are arranged, the bank being configured to enclose at least a part of the outer circumferential edge of the display region, and an outer circumference protection part provided on the bank and on an outer circumferential region of the bank, the outer circumference protection part being formed of a resin material.

24 Claims, 25 Drawing Sheets

DISPLAY MODULE, DISPLAY APPARATUS, AND MANUFACTURING METHODS THEREOF

CROSS REFERENCE TO RELATED APPLICATION

The present application is related to, claims priority from and incorporates by reference Japanese Patent Application No. 2012-018512, filed on Jan. 31, 2012.

TECHNICAL FIELD

The present invention relates to a display module, a display apparatus, and manufacturing methods of the display module and the display apparatus.

BACKGROUND

Conventionally, there are self-luminous type light emitting elements such as a Light Emitting Diode (hereinafter referred to as "LED"), an organic electroluminescence element (hereinafter referred to as "organic EL element"), an inorganic EL element or the like. Further, there are non-self-luminous type elements such as a liquid crystal display (LCD) or the like. A self-luminous type light emitting element array is constituted by arranging a plurality of self-luminous type light emitting elements in a matrix. The display apparatus using the self-luminous type light emitting element array exhibits less light loss and higher efficiency than a light-valve type display apparatus such as an LCD. In particular, a direct-view type display apparatus using the self-luminous type light emitting element array can be lightened and thinned, since a backlight can be eliminated. A projection type display apparatus such as a head up display (hereinafter referred to as "HUD"), a projector or a rear projection system using the non-self-luminous type light emitting elements needs a separate light source. In contrast, a projection type display apparatus using the self-luminous type light emitting elements does not need such a separate light source, and therefore can be compact in size.

As the display apparatus using the self-luminous type light emitting element array, a display apparatus is known in which a plurality of semiconductor thin film light emitting elements are stacked on a substrate in a matrix as disclosed in JP Laid-Open Patent Application No. 2010-199176, for example.

In the meantime, there is a case when an outer circumferential region of a display region on which a plurality of light emitting elements arranged is sealed in a structure in which the plurality of light emitting elements are arranged on a substrate. Potting is considered as a method to seal the outer circumferential region. In the case when potting is performed on the outer circumferential region, an adverse effect such as display luminance deterioration or the like occurs if a potting material enters into the display region.

One of objects of the present invention is to provide a display module, a display apparatus, and manufacturing methods of the display module and the display apparatus that seal an outer circumferential region of a display region using the potting while preventing entrance of a potting material into the display region.

SUMMARY

In considering of the above objects, a display module disclosed in the application includes a substrate; a plurality of light emitting elements provided on the substrate; a bank provided on the substrate at a position separated by a predetermined distance from an outer circumferential edge of a display region on which the plurality of light emitting elements are arranged, the bank being configured to enclose at least a part of the outer circumferential edge of the display region; and an outer circumference protection part provided on the bank and on an outer circumferential region of the bank, the outer circumference protection part being formed of a resin material.

In another view, a projection type display apparatus disclosed in the application includes: a display module; and an optical system configured to project light emitted by the display module on a predetermined place to display an image on the predetermined place, wherein the display module includes: a substrate; a plurality of light emitting elements provided on the substrate; a bank provided on the substrate at a position separated by a predetermined distance from an outer circumferential edge of a display region on which the plurality of light emitting elements are arranged, the bank being configured to enclose at least a part of the outer circumferential edge of the display region; and an outer circumference protection part provided on the bank and on an outer circumferential region of the bank, the outer circumference protection part being formed of a resin material.

In another view, a direct-view-type display apparatus disclosed in the application, includes: a display module, wherein the display module includes: a substrate; a plurality of light emitting elements provided on the substrate; a bank provided on the substrate at a position separated by a predetermined distance from an outer circumferential edge of a display region on which the plurality of light emitting elements are arranged, the bank being configured to enclose at least a part of the outer circumferential edge of the display region; and an outer circumference protection part provided on the bank and on an outer circumferential region of the bank, the outer circumference protection part being formed of a resin material.

In another view, a manufacturing method of a display module disclosed in the application, includes: preparing a substrate with a display region on which a plurality of light emitting elements are arranged; providing a bank on the substrate at a position separated by a predetermined distance from an outer circumferential edge of the display region, the bank being configured to enclose at least a part of the outer circumferential edge of the display region; and sealing a region on the bank and an outer circumferential region of the bank by potting.

In other views, disclosed in the application, manufacturing methods of a projection type display apparatus and a direct-view-type display apparatus include: manufacturing a device module; and providing an optical system configured to project light emitted by the device module on a predetermined place to display an image on the predetermined place, wherein the manufacturing of the device module includes: preparing a substrate with a display region on which a plurality of light emitting elements are arranged; providing a bank on the substrate at a position separated by a predetermined distance from an outer circumferential edge of the display region, the bank being configured to enclose at least a part of the outer circumferential edge of the display region; and sealing a region on the bank and an outer circumferential region of the bank by potting.

According to the present invention, the outer circumferential region of the display region is sealed using the potting while entrance of the potting material into the display region is prevented.

DESCRIPTION OF EMBODIMENTS

Embodiments of the present invention will be described in detail below with reference to the drawings.

First Embodiment

[Configuration of Display Module]

Figure 1:
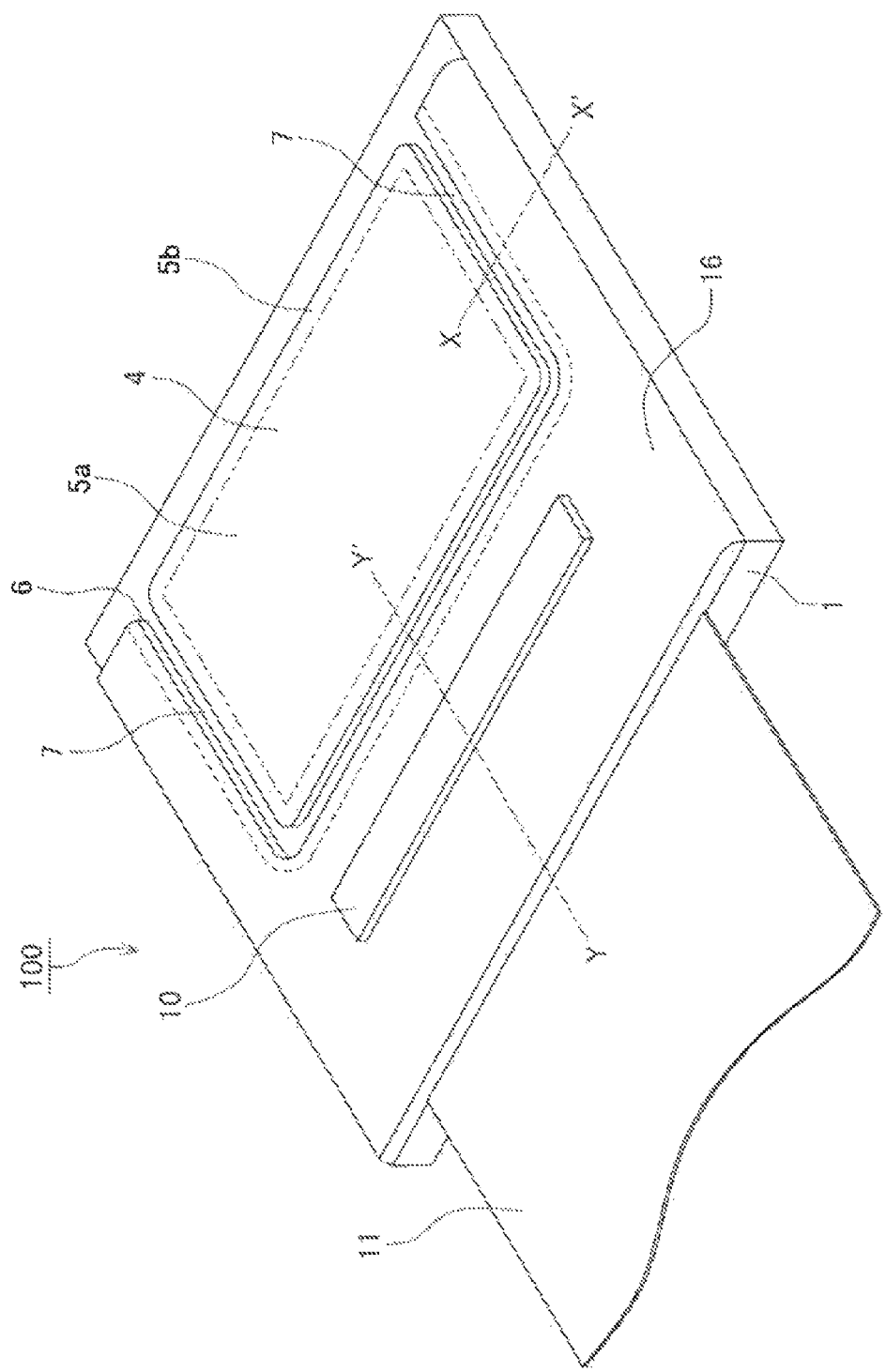
FIG. 1 is an external perspective view of an entire display module (DM) according to a first embodiment.
Figure 2:
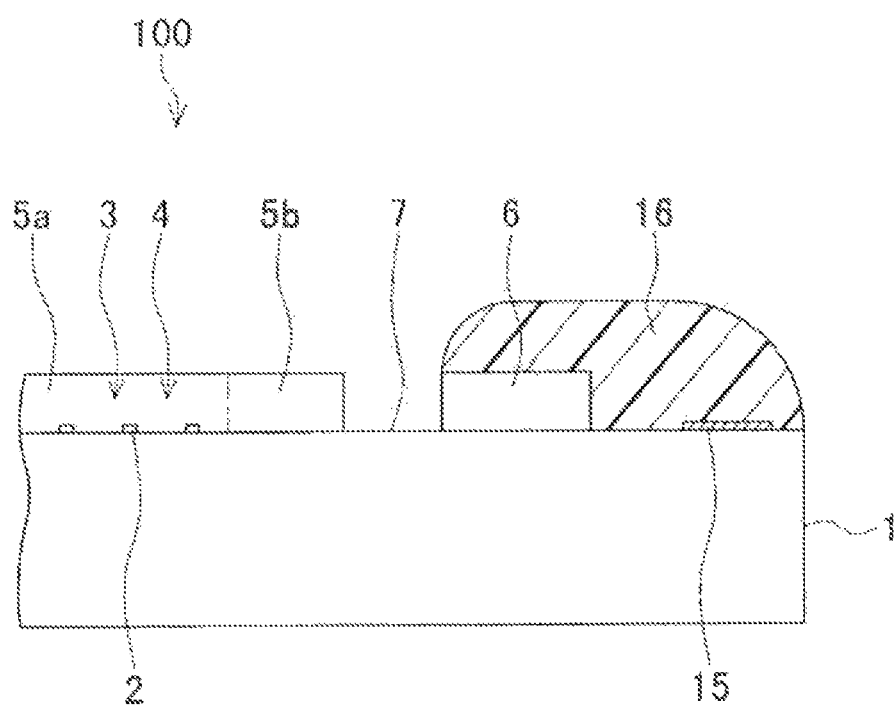
FIG. 2 is a cross-sectional view along a broken line X-X' in FIG. 1.
Figure 3:
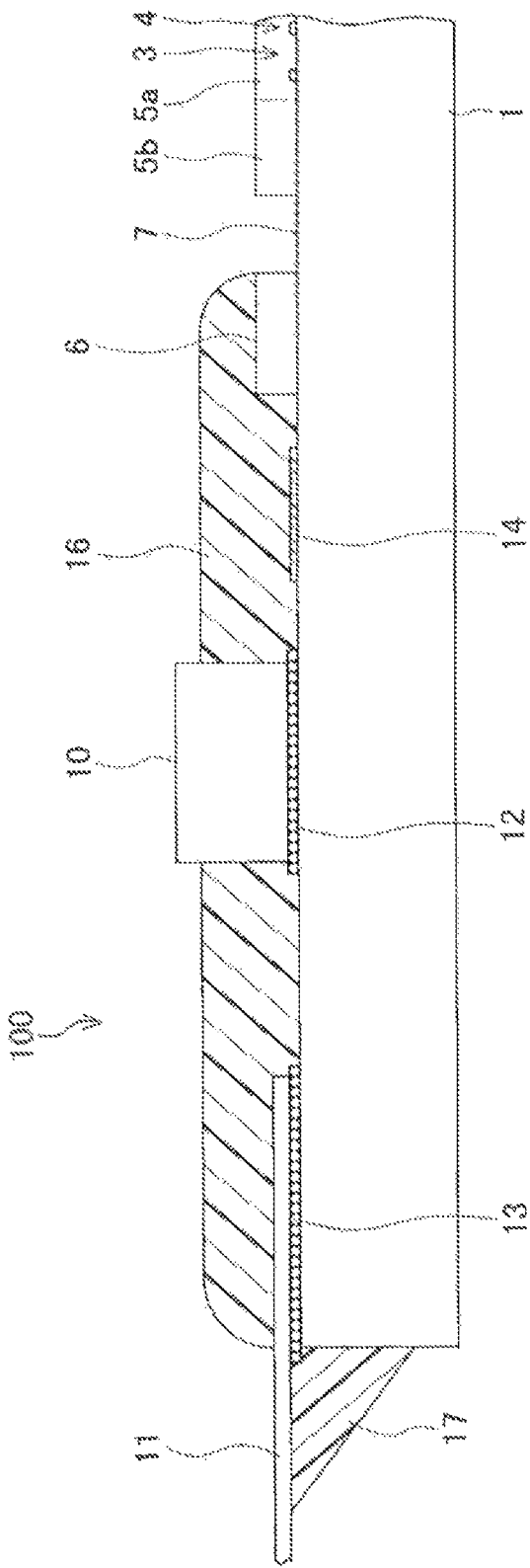
FIG. 3 is a cross-sectional view along a broken line Y-Y' in FIG. 1.

FIG. 1 is an external perspective view of an entire display module (hereinafter referred to as "DM") 100 according to a first embodiment. FIG. 2 is a cross-sectional view along a broken line X-X' in FIG. 1. FIG. 3 is a cross-sectional view along a broken line Y-Y' in FIG. 1. In FIGS. 1 to 3, the DM 100 is a panel-shaped module and a display panel.

As illustrated in FIGS. 1 to 3, the DM 100 includes a substrate 1. The substrate 1 is configured with a semiconductor substrate such as Si, GaAs, GaP, InP, GaN, ZnO or the like, a ceramic substrate such as AlN, $Al_2O_3$ or the like, a glass substrate, a glass epoxy substrate, a metal substrate such as Cu, Al or the like, a plastic substrate or the like, for example.

A plurality of light emitting elements 2 are arranged on the front surface of the substrate 1. Here, the light emitting elements 2 are thin film semiconductor light emitting elements. In addition, the light emitting elements 2 are LED elements. The plurality of light emitting elements 2 configure an LED micro display 3 (hereinafter referred to as "LMD").

An LMD protection part 5a as a protection part that protects the plurality of light emitting elements 2 are provided on a display region 4 (or the LMD 3) in which the plurality of light emitting elements 2 are arranged on the substrate 1. A dummy LMD protection part 5b is provided on the outer circumference of the LMD protection part 5a. The dummy LMD protection part 5b functions to prevent a phenomenon in which edge parts of the LMD 3 are abnormally illuminated, for example. The LMD protection part 5a and the dummy LMD protection part 5b are formed of an identical material, and are preferably formed of a material with a high transmissivity such as epoxy resin, silicon resin, acrylic resin, amide-imide resin or the like, for example. In addition, the LMD protection part 5a and the dummy LMD protection part 5b are preferably planarized.

A bank 6 is provided on the front surface of the substrate 1 at a position separated by a predetermined distance from the outer circumferential edge of the display region 4 (or the dummy LMD protection part 5b). The bank 6 encloses at least a part of the outer circumferential edge of the display region 4 (or the dummy LMD protection part 5b). A trench 7 is formed between the dummy LMD protection part 5b and the bank 6 on the front surface of the substrate 1. That is, the trench 7 is formed on the outer circumference of the dummy LMD protection part 5b. The trench 7 is a boundary groove. The bank 6 is formed on an outer circumference of the trench 7 that is the boundary. The bank 6, the LMD protection part 5a and the dummy LMD protection part 5b are formed of the same material, for example. The bank 6 has a height of approximately 100 μm, for example.

A display driver integrated circuit 10 (hereinafter referred to as "driver IC chip") and a flat flexible cable (e.g. flat type flexible cable) 11 are fixed on the substrate 1. The display driver integrated circuit 10 is a drive circuit that selectively drives each of the light emitting elements 2. The flat type flexible cable 11 is a cable that connects the driver IC chip 10 to an external control circuit. The driver IC chip 10 is fixed on the substrate 1 via an anisotropic conductive film 12. The flat type flexible cable 11 is fixed on the substrate 1 via an anisotropic conductive film 13. Specifically, the driver IC chip 10 includes a terminal in which bumps are formed on the front surface thereof, is placed face down, is affixed on the substrate 1 via the anisotropic conductive film 12, and is electrically connected to wiring patterns formed on the substrate 1. The flat type flexible cable 11 is affixed on the substrate 1 via the anisotropic conductive film 13, and is electrically connected to wiring patterns formed on the substrate 1. The LMD 3 and the driver IC chip 10 are connected to each other with wiring patterns (anode connection wirings 31 and cathode connection wirings 34 discussed later) formed on the substrate 1. In addition, the driver IC chip 10 and the flat-type cable 11 are connected to each other with wiring patterns formed on the substrate 1 (input signal connection wiring discussed later). Moreover, anode pads 14 and cathode pads 15 that are terminals for light emitting element test are provided on an outer circumferential region of the display region 4. In FIGS. 1 to 3, the various wiring patterns formed on the substrate 1 are not illustrated.

An outer circumference protection part 16 is formed on the outer circumferential region of the display region 4 on the front surface of the substrate 1 to cover the front surface of the substrate 1. Specifically, the outer circumference protection part 16 is formed on the bank 6 and on an outer circumferential region of the bank 6, that is, an outer circumferential region of the trench 7. More specifically, the outer circumference protection part 16 is formed between an edge part of a boundary between the bank 6 and the trench 7 on the top part (or upper surface part) of the bank 6 and an edge part on the outermost circumference of the substrate 1. The anode pads 14, the cathode pads 15, the various wiring patterns, the anisotropic conductive films 12 and 13, and the flat-type cable 11 are provided on the outer circumferential region of the display region 4, and are covered by the outer circumference protection part 16. In addition, side surface parts of the driver IC chip 10 are covered by the outer circumference protection part 16. The outer circumference protection part 16 is formed of a resin material, and preferably silicon resin.

A cable protection part 17 made of a resin material is formed between a back surface of the flat-type cable 11 (surface of the backside of the LMD 3 from a plan view) and a side surface of the substrate 1 to cover the anisotropic conductive film 13 and the wiring patterns of the flat-type cable 11. The anisotropic conductive film 13 and the flat-type cable 11 extend out of the substrate 1.

In the case when the substrate 1 is made of a conductive material, an insulation layer is formed between the front surface of the substrate 1 and the wiring patterns (e.g. anode connection wirings 31 and cathode connection wirings 34), various pads (electrode), and the plurality of light emitting elements 2.

In the present embodiment, one driver IC chip 10 is provided on the substrate 1. However, a plurality of the driver IC chips may be provided in accordance with circuit configurations.

Figure 4:
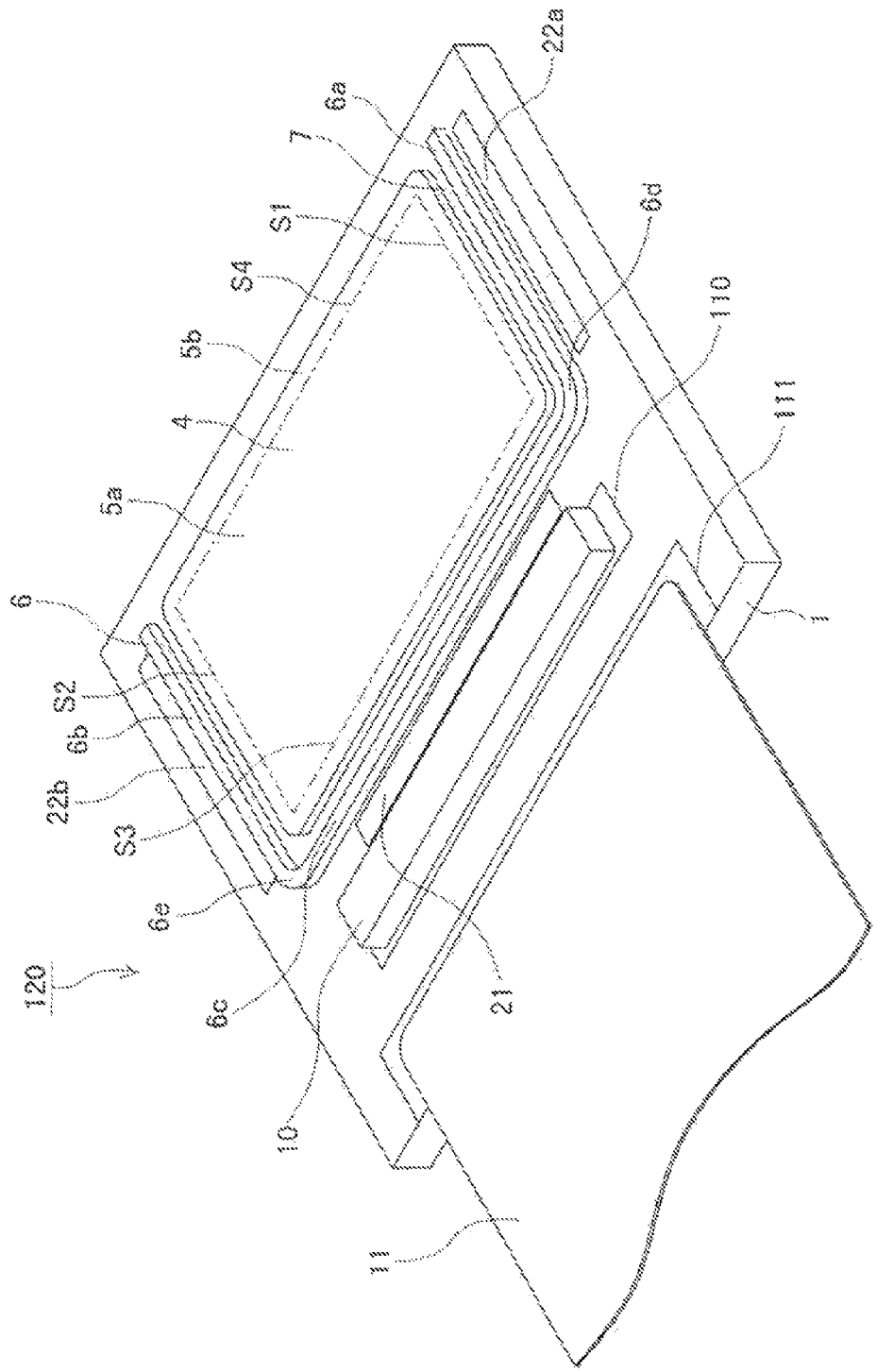
FIG. 4 is a perspective view of the DM without an outer circumference protection part of the DM in FIG. 1.

FIG. 4 is a perspective view of the DM 120 without the outer circumference protection part 16 of the DM 100 in FIG. 1. Hereinafter, a configuration of the bank 6 and the arrangement of the anode pads 14 and the cathode pads 15 for light emitting element test will be described with reference to FIG. 4. In FIG. 4, the wiring patterns are not illustrated.

As illustrated in FIG. 4, the display region 4 is substantially rectangular from a plan view, and includes a right side S1 (first side), a left side S2 (second side), a lower side S3 (third side), and an upper side S4 seen from the front surface of the display region 4 and the driver IC chip 10 placed below.

A pad formation region 21 that includes the plurality of anode pads 14 are arranged outside of the lower side S3 of the display region 4 on the front surface of the substrate 1. In addition, pad formation regions 22a and 22b that include the plurality of cathode pads 15 are, respectively, arranged outside of the right side S1 and left side S2 of the display region 4.

The bank 6 is provided to enclose three of four sides of the display region 4 (or dummy LMD protection part 5b) excluding a predetermined side. Specifically, the bank 6 is provided between the display region 4 (or dummy LMD protection part 5b) and the pad formation regions 21, 22a and 22b to enclose the three sides S1 to S3 of the four sides S1 to S4 of the display region 4 excluding the upper side S4 without a pad formation region outside thereof. More specifically, the bank 6 includes facing parts 6a and 6b (first and second facing parts) that face the first and second sides S1 and S2 of the displaying region that are opposing from each other, S1 and S2 being two of the three sides S1 to S3 excluding the upper side S4, a facing part 6c (third facing part) that faces the third side S3 of the display region that extends between S1 and S2, a linkage part 6d (first linkage part) that links the facing part 6a and the facing part 6c, and a linkage part 6e (second linkage part) that links the facing part 6b and the facing part 6c. The example in FIG. 4, the facing parts 6a, 6b and 6c are in a linear shape. The linkage parts 6d and 6e are configured to smoothly link the facing part 6a to the facing part 6c and the facing part 6b to the facing part 6c, respectively. Specifically, the linkage parts 6d and 6e are formed in an arc shape to be convex from a plan view. That is, the bank 6 is formed to be curved at corner parts from a plan view.

Figure 5:
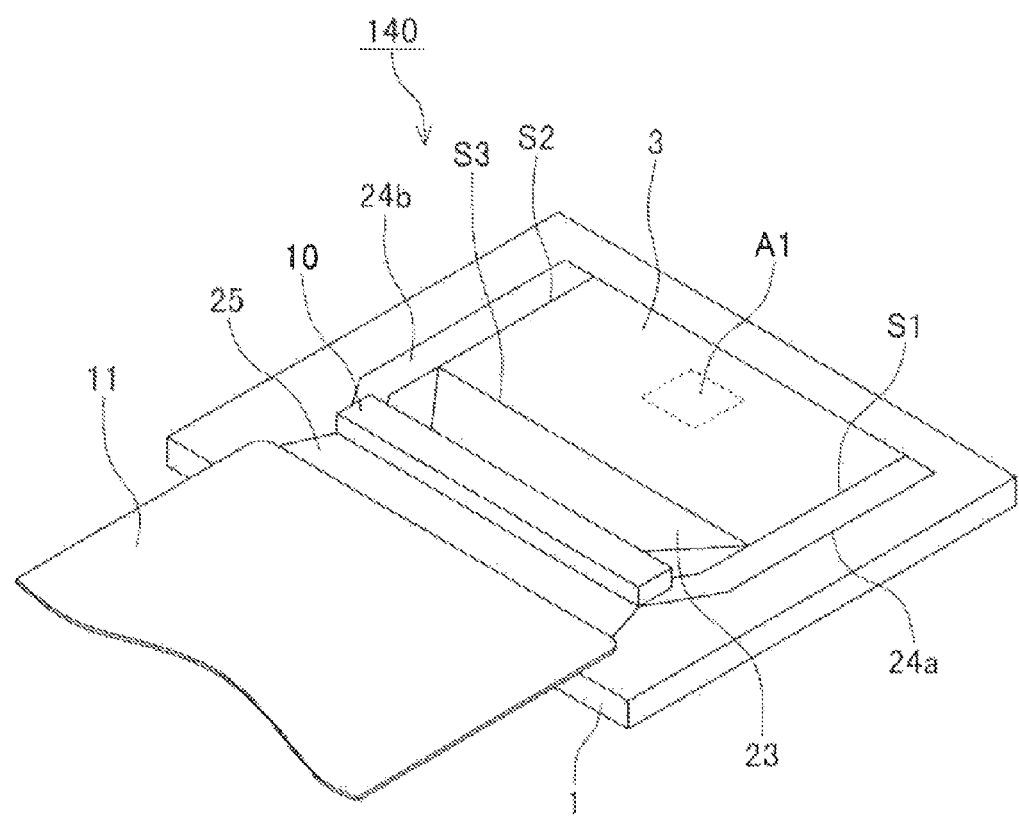
FIG. 5 is a perspective view of a non-display module (NDM) that is the DM in FIG. 1 from which the outer circumference protection part, a bank, an LMD protection part and a dummy LMD protection part are omitted.

FIG. 5 is a perspective view of a NDM 140 that is the DM 100 in FIG. 1 from which the outer circumference protection part 16, the bank 6, the LMD protection part 5a and the dummy LMD protection part 5b are omitted.

In FIG. 5, the NDM 140 includes the substrate 1, and includes the LMD 3 formed by the plurality of light emitting elements 2, an anode connection wiring region 23, cathode connection wiring regions 24a and 24b, and an input signal connection wiring region 25 on the front surface of the substrate 1.

The anode connection wiring region 23 is arranged outside of the lower side S3 of the display region 4 (or LMD 3). The cathode connection wiring regions 24a and 24b are, respectively, arranged outside of the right side S1 and the left side S2 of the display region 4 (or LMD 3). The input signal connection wiring region 25 is a region in which a plurality of input signal connection wirings are formed, and is arranged between the driver IC chip 10 and the flat-type cable 11. The pad formation region 21 in FIG. 4 is arranged in the anode connection wiring region 23. In addition, the pad formation regions 22a and 22b in FIG. 4 are, respectively, arranged outside of the cathode connection wiring regions 24a and 24b.

The LMD 3 is electrically connected to the driver IC chip 10 via the anode connection wiring region 23 and the cathode connection wiring regions 24a and 24b. The driver IC chip 10 is electrically connected to the flat-type cable 11 via the input signal connection wiring region 25. The flat-type cable 11 is electrically connected to the external control circuit (not illustrated).

Figure 6:
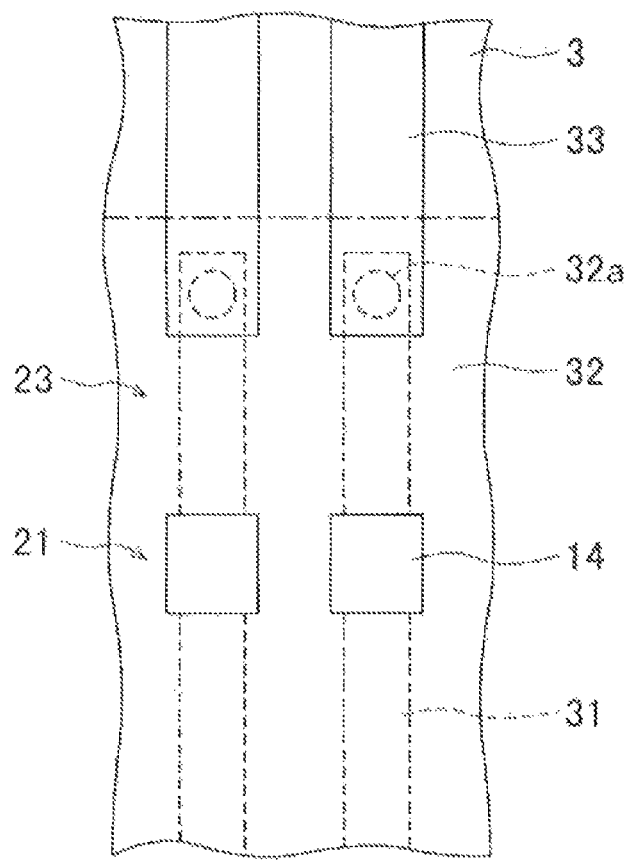
FIG. 6 is a partially enlarged plain view of an anode connection wiring region in FIG. 5.

FIG. 6 is a partially enlarged plain view of the anode connection wiring region 23 in FIG. 5. In FIG. 6, the plurality of anode connection wirings 31 are formed in the anode connection wiring region 23. An interlayer insulation film 32 is formed on the plurality of anode connection wirings 31, and a plurality of anode wirings 33 in the LMD 3 are formed on the interlayer insulation film 32. One end of each of the anode connection wirings 31 is connected to the corresponding anode wiring 33 via an opening part 32a for contact provided on the interlayer insulation film 32. The other end of each of the anode connection wirings 31 is connected to a pad connected to bumps of the driver IC chip 10. In addition, an anode pad 14 for light emitting element test is formed in the middle of each of the anode connection wirings 31, and the plurality of anode pads 14 are formed on the pad formation region 21.

Figure 7:
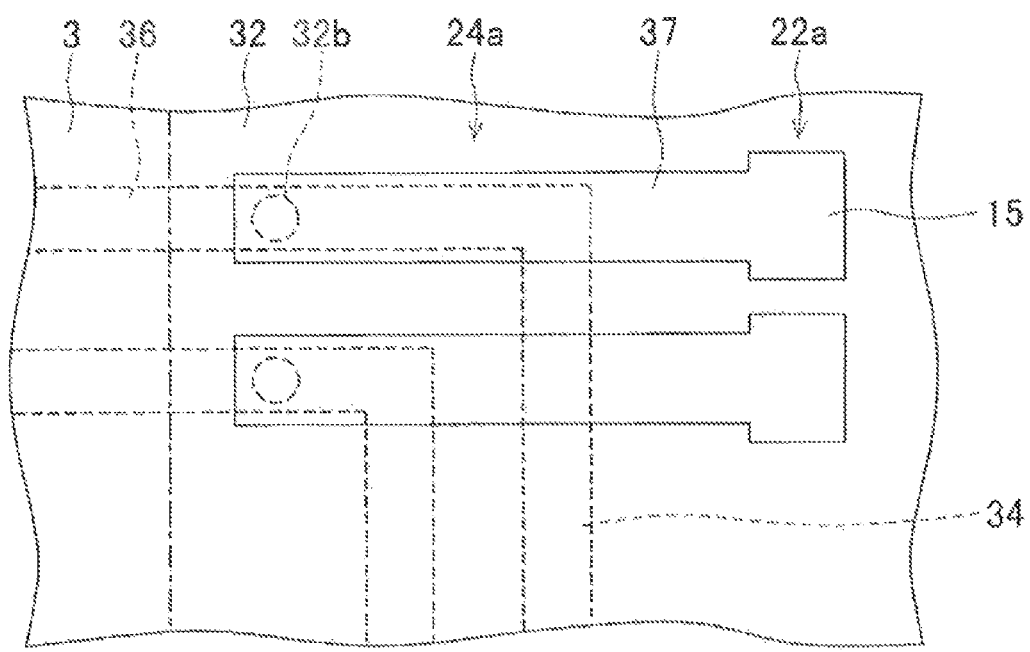
FIG. 7 is a partially enlarged plain view of a cathode connection wiring region in FIG. 5.

FIG. 7 is a partially enlarged plain view of the cathode connection wiring region 24a in FIG. 5. In FIG. 7, the plurality of cathode connection wirings 34 are formed in the cathode connection wiring region 24a. One end of each of the anode connection wirings 34 is connected to the cathode wiring 36 corresponding thereto in the LMD 3. The other end of each of the cathode connection wirings 34 is connected to a pad connected to bumps of the driver IC chip 10. In addition, the interlayer insulation film 32 is formed on the plurality of cathode connection wirings 34, and a plurality of pad connection wirings 37 are formed on the interlayer insulation film 32. One end of each of the pad connection wirings 37 is connected to the corresponding cathode connection wiring 34 via an opening part 32b for contact provided on the interlayer insulation film 32. The other end of each of the pad connection wirings 37 is connected to the corresponding cathode pad 15 for light emitting element test provided on the interlayer insulation film 32. The plurality of cathode pads 15 are formed on the pad formation region 22a.

In the same manner as described above, the plurality of cathode connection wirings 34 are formed in the cathode connection wiring region 24b in FIG. 5, and the plurality of cathode pads 15 are formed on the pad formation region 22b.

In the explanation below, the cathode connection wirings 34 in the cathode connection wiring region 24a are referred to as cathode connection wirings 34a, and the cathode connection wirings 34 in the cathode connection wiring region 24b are referred to as cathode connection wirings 34b if necessary to be especially distinguished.

Figure 8:
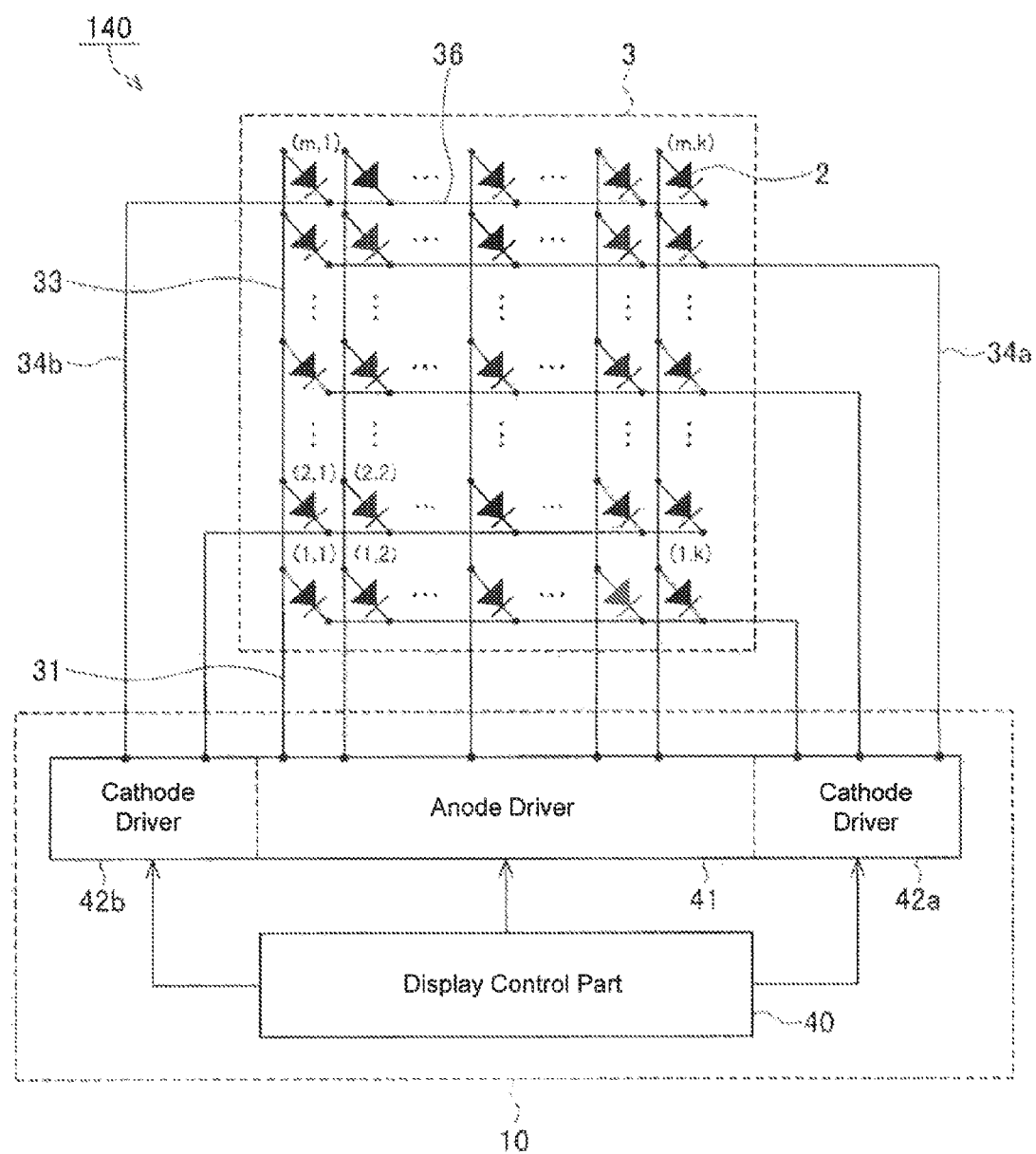
FIG. 8 is a diagram illustrating an equivalent circuit of the NDM in FIG. 5.

FIG. 8 is a diagram illustrating an equivalent circuit of the NDM 140 in FIG. 5. In FIG. 8, the NDM 140 includes the LMD 3, a display control part 40, an anode driver 41 and cathode drivers 42a and 42b. The display control part 40, the anode driver 41 and the cathode drivers 42a and 42b are preferably integrated with the driver IC chip 10.

The LMD 3 is configured by a passive type simple matrix of "m" rows and "k" columns, and includes the plurality of (k) anode wirings 33, the plurality of (m) cathode wirings 36, and the plurality of (m*k) light emitting elements 2 (1, 1) to 2 (m, k). The plurality of (k) anode wirings 33 are arranged in parallel to each other in a row direction (lateral direction), and extend in a column direction (longitudinal direction). The column direction and row direction cross. The plurality of (m) cathode wirings 36 are arranged in parallel to each other in the column direction, and extend in the row direction. The plurality of (m*k) light emitting elements 2 (1, 1) to 2 (m, k) are provided at crossings between the anode wirings 33 and the cathode wirings 36, and are electrically connected to the corresponding anode wiring 33 and the cathode wiring 36, respectively. In this regard, the light emitting element 2 (i, j) indicates the light emitting element 2 provided at the crossing between the i-th row and the j-th column. The light emitting element 2 (i, j) is a light emitting element at the crossing between the i-th row and the j-th column.

The k anode wirings 33 are connected to the anode driver 41 via the k anode connection wirings 31. The k anode connection wirings 31 are formed on the anode connection wiring region 23 in FIG. 5.

The respective m cathode wirings 36 are alternately connected to cathode connection wirings 34a or 34b. Specifically, odd cathode wirings 36 are connected to a cathode driver 42a via the m/2 cathode connection wirings 34a. In addition, even cathode wirings 36 are connected to a cathode driver 42b via the m/2 cathode connection wirings 34b. The m/2 cathode connection wirings 34a extended from the odd cathode wirings 36 are formed on the cathode connection wiring region 24a in FIG. 5. The m/2 cathode connection wirings 34b extended from the even cathode wirings 36 are formed on the cathode connection wiring region 24b in FIG. 5.

The k anode wirings 33 are connected to the k anode pads 14 in the pad formation region 21 in FIG. 4. The odd m/2 cathode wirings 36 are connected to the m/2 cathode pads 15 in the pad formation region 22a in FIG. 4 via the m/2 pad connection wirings 37. The even m/2 cathode wirings 36 are connected to the m/2 cathode pads 15 in the pad formation region 22b in FIG. 4 via the m/2 pad connection wirings 37.

The anode driver 41, and the cathode drivers 42a and 42b are connected to the display control part 40. The display control part 40 is connected to the external control circuit (not illustrated) via the flat-type cable 11 and the plurality of input signal connection wirings in the input signal connection wiring region 25 in FIG. 5.

The display control part 40 outputs an anode drive signal and a cathode drive signal for driving each of the light emitting elements 2 of the LMD 3 based on display data given by the external control circuit or the like (not illustrated). The display control part 40 includes a processor and/or complex logic circuit with predetermined operation functions, a buffer for performing transmission and receipt of data between the processor or the like and the external control circuit or the like, a storage circuit for storing the data from the external control circuit or the like, a timing signal generation circuit (oscillation circuit) that gives a timing signal to the control circuit, a display timing signal, a timing signal for reading from and writing to the storage circuit or the like, a drive signal output circuit that outputs display data read from the storage circuit or display data obtained by processing the read data as drive signals, various resistors that stores information and/or control commands regarding display functions given from outside, and the like, for example.

The anode driver 41 has a function to supply predetermined currents through the columns of the light emitting elements 2 connected to the anode wiring 33 of the LMD 3 based on the anode drive signal (e.g. an instruction to emit light or not to emit light.) supplied from the display control part 40. The anode driver 41 includes a shift register, a latch circuit and a constant current circuit, for example. The shift resister receives a serial anode drive signal supplied from the display control part 40, performs serial-parallel conversion, and outputs parallel light-emission data. The latch circuit is connected to an output side of the shift register, and is a circuit that stores the parallel light-emission data output from the shift register. The constant current circuit is connected to an output side of the latch circuit, and supplies the light emitting elements 2 currents based on the parallel light-emission data stored in the latch circuit via the anode wirings 33.

The cathode drivers 42a and 42b are configured by a selector circuit and the like, and have function to scan the rows of the light emitting elements 2 connected to the cathode wirings 36 based on the cathode drive signals supplied from the display control part 40.

Figure 9:
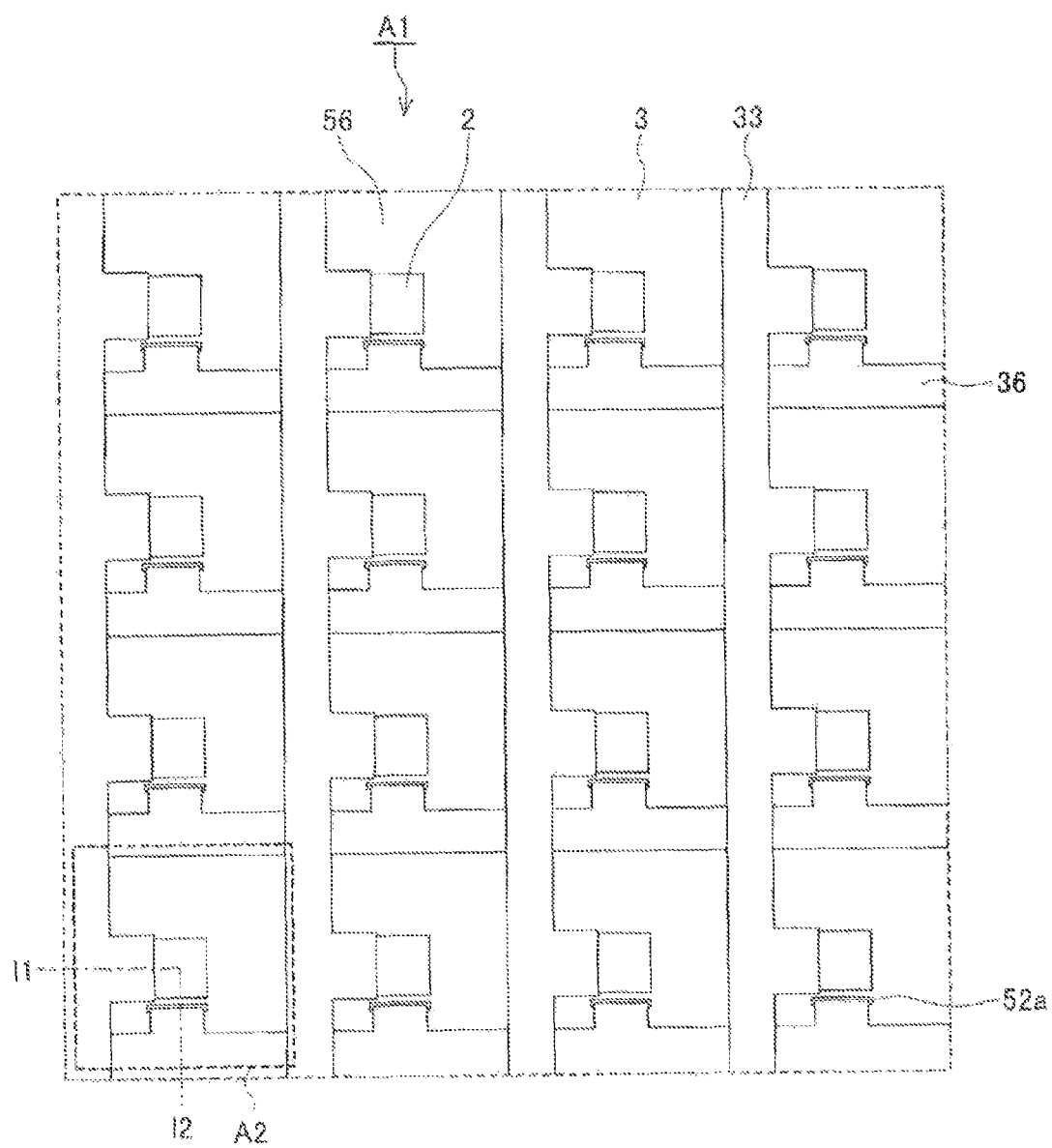
FIG. 9 is a partial plan view illustrating pixels of 4*4 matrix included in a broken line square region A1 in the LMD in FIG. 5.

FIG. 9 is a partial plan view illustrating pixels of 4*4 matrix included in a broken line square region A1 in the LMD 3 in FIG. 5. As illustrated in FIG. 9, the LMD 3 includes the plurality of anode wirings 33 formed in a band shape, the plurality of cathode wirings 36 formed in a band shape, and the plurality of light emitting elements 2. The plurality of anode wirings 33 are arranged in parallel to each other in a row direction (lateral direction), and extend in a column direction (longitudinal direction). The plurality of cathode wirings 36 are arranged in parallel to each other in the column direction, and extend in the row direction. The plurality of light emitting elements 2 are arranged in a matrix at crossings between the anode wirings 33 and the cathode wirings 36. The interlayer insulation film 32 (not illustrated in FIG. 9) is provided between the anode wirings 33 and the cathode wirings 36.

Figure 10:
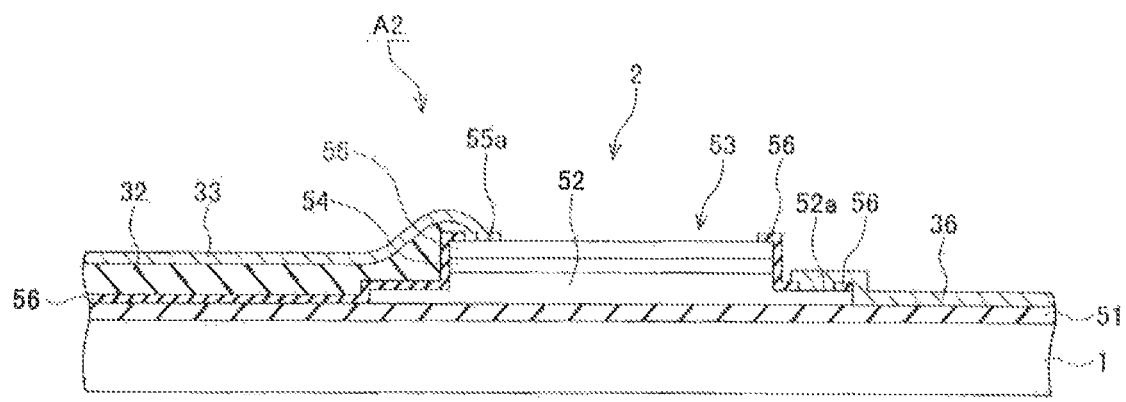
FIG. 10 is a cross-sectional view along a broken line I1-I2 in a broken line square region A2 in FIG. 9.

FIG. 10 is a cross-sectional view along a broken line I1-I2 in a broken line square region A2 in FIG. 9. As illustrated in FIG. 10, each light emitting element 2 is bonded to the substrate 1 via a planarizing layer 51 that is an insulation layer.

Each light emitting element 2 includes, for example, an N-type semiconductor layer 52 bonded onto the planarizing layer 51, and a light emission part 53. The light emission part 53 includes an active layer 54 provided on the N-type semiconductor layer 52, a P-type semiconductor layer 55 provided on the active layer 54, and the like.

In addition, on the planarizing layer 51, the cathode wiring 36 is formed in a band shape, extends in an N contact part 52a of the N-type semiconductor layer 52, and is in ohmic contact with the N-type semiconductor layer 52 at the N contact part 52a.

A periphery of each light emission part 53 is covered with the insulation film 56. On the insulation film 56, the anode wiring 33 is formed in a band shape via the interlayer insulation film 32, extends to a P contact part 55a of a P-type semiconductor layer 55, and is in ohmic contact with the P-type semiconductor layer 55 at the P contact part 55a.

As discussed above, the planarizing layer 51 (as the insulation layer) is formed between the substrate 1 and the light emitting element 2. Thereby, the planarizing layer 51 electrically insulates the respective light emitting elements 2 (pixels), so as to form the matrix structure.

An insulation layer may be provided between the substrate 1 and the planarizing layer 51.

A heat sink (not illustrated) or a metal housing (not illustrated) may be attached to a backside of the substrate 1 of the above-described DM 100 (opposite surface of the surface on which the LMD 3 is provided). In this case, in order to effectively release heat from the LMD 3 and the driver IC chip 10, a heat release paste or heat release sheet (not illustrated) with insulation property are provided between the backside of the substrate 1 and the heat sink or the metal housing.

[Manufacturing Method of Display Module]

Figure 11:
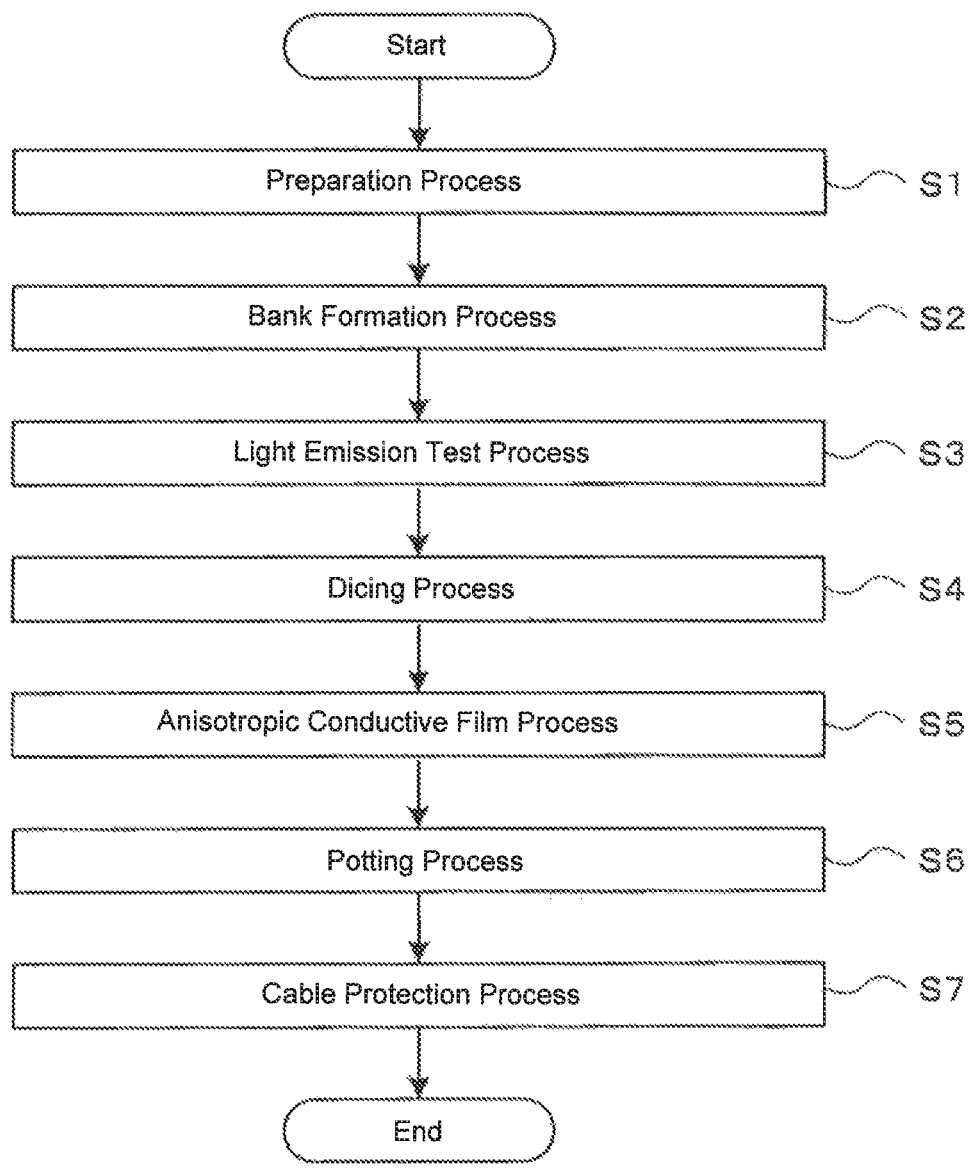
FIG. 11 is a process flowchart of a manufacturing method of the DM in the first embodiment.

FIG. 11 is a process flowchart of a manufacturing method of the DM 100 in the first embodiment. Hereinafter, each manufacturing process of the manufacturing method of the DM 100 will be described with reference to FIG. 11.

In FIG. 11, the manufacturing method of the DM 100 includes preparation process S1, bank formation process S2, light emission test process S3, dicing process S4, anisotropic conductive film process S5, potting process S6, and cable protection process S7.

The preparation process S1 is a process to prepare a substrate with the display region 4 on which the plurality of the light emitting elements 2 are provided. In the present embodiment, the preparation process S1 includes a process to form the plurality of LMDs 3 on the substrate.

The bank formation process S2 is a process to form the bank 6 on the substrate. In the present embodiment, the bank formation process S2 includes a process to form the LMD protection part 5a and the dummy LMD protection part 5b on the display region 4.

The light emission test process S3 is a process to perform a light emission test for the respective light emitting elements 2 in the LMD 3.

The dicing process S4 is a process to cut the substrate on which the plurality of LMDs 3 are formed into each LMD 3 to obtain a plurality of respective substrates with one LMD 3.

Anisotropic conductive film process S5 is a process to provide the driver IC chip 10 and the flat-type cable 11 on the substrate using an anisotropic conductive film.

Potting process S6 is a process to seal the region on the bank 6 and an outer circumferential region of the bank 6 by potting.

Cable protection process S7 is a process to form the cable protection part 17 that protects the flat-type cable 11.

Figure 14:
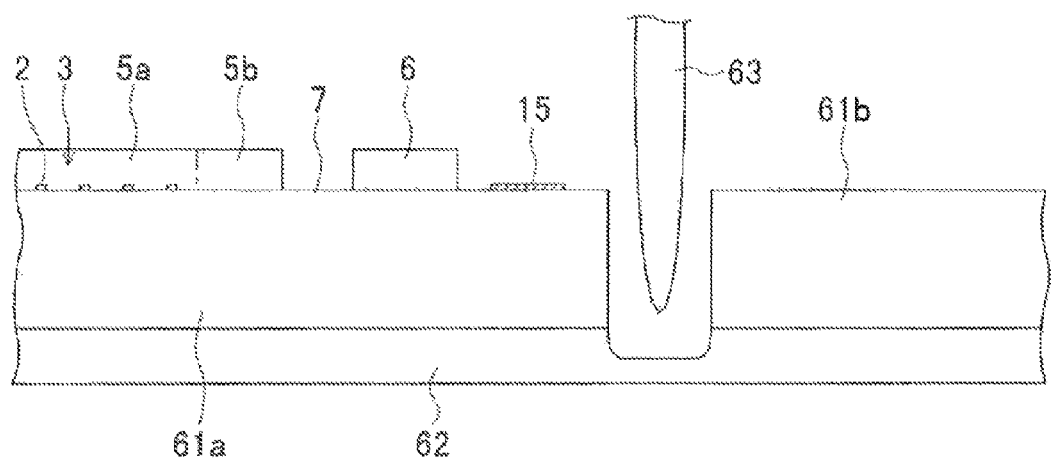
FIG. 14 explains each of the processes in FIG. 11.
Figure 15:
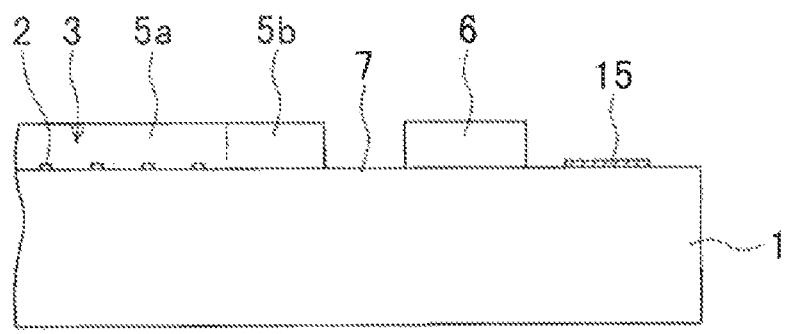
FIG. 15 explains each of the processes in FIG. 11.
Figure 16:
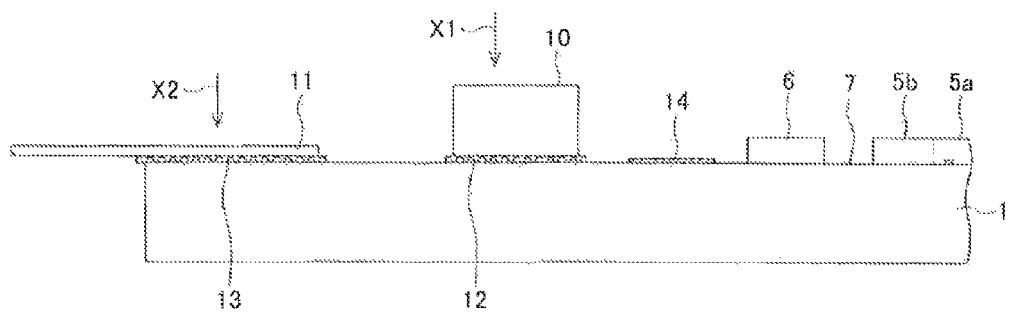
FIG. 16 explains each of the processes in FIG. 11.

FIGS. 12 to 16 explain each of processes in FIG. 11. FIGS. 12 to 15 illustrate a cross-sectional view corresponding to the cross-sectional view along the broken line X-X' in FIG. 1. FIG. 16 illustrates the cross-sectional view along the broken line Y-Y' in FIG. 1. Hereinafter, each of the manufacturing processes in FIG. 11 will be described in detail with reference to FIGS. 12 to 16.

<Preparation Process S1>

Figure 12:
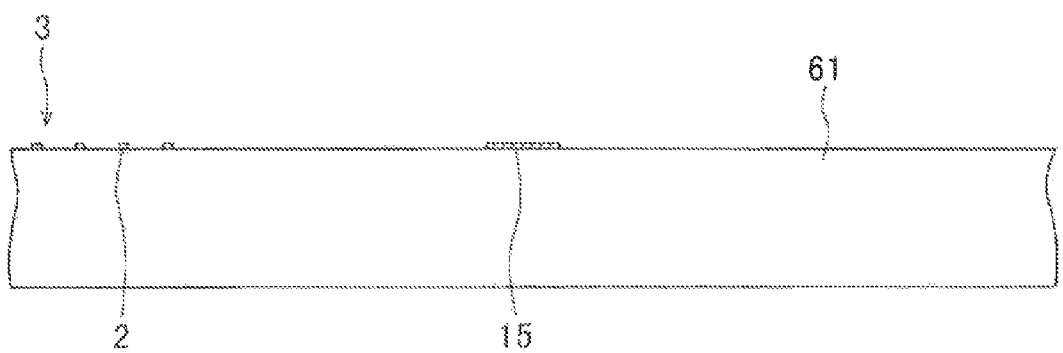
FIG. 12 explains each of processes in FIG. 11.

In preparation process S1, as illustrated in FIG. 12, a formation substrate 61 on which apparatus formation is performed is prepared. The formation substrate 61 may be formed of a semiconductor substrate composed of Si, GaAs, GaP, InP, GaN, ZnO or the like, a ceramic substrate composed of AlN, $Al_2O_3$ or the like, a glass substrate, a glass epoxy substrate, a metal substrate composed of Cu, Al or the like, or a plastic substrate, for example.

Next, an insulation layer (not illustrated) is formed on the entire front surface of the formation substrate 61. The smoothing layer 51 is formed on a region of the front surface of the insulation layer on which the LMDs 3 are formed (see FIG. 10).

Then, on the smoothing layer 51, the plurality of light emitting elements 2 are arranged in a matrix. The light emitting elements 2 are bonded to the smoothing layer 51 by the intermolecular bonding force, for example (see FIGS. 9, 10 and 12).

Next, the insulation film 56 is formed to cover the periphery of each light emission part 53 of the light emitting element 2 (see FIGS. 9 and 10). An opening part to expose most of the front surface of the light emission part 53 excluding the periphery part thereof and an opening part to expose the N contact part 52a that is a part of the surface of the N-type semiconductor layer 52 are formed on the insulation film 56.

Next, the cathode wirings 36 are formed on the planarizing layer 51 (also see FIGS. 9 and 10). Each of the cathode wirings 36 is formed to be in ohmic contact with the N-type semiconductor layer 52 at the N contact part 52a. In addition, while the cathode wirings 36 are formed, various wires and pads are formed on the insulation layer in a region (non-LMD region) out of the region on which the LMDs 3 are formed. Specifically, the plurality of anode connection wirings 31 in the anode connection wiring region 23 in FIG. 5, the plurality of cathode connection wirings 34 in the cathode connection wiring regions 24a and 24b in FIG. 5, and the plurality of input signal connection wirings in the input signal connection wiring region 25 in FIG. 5 are formed. In addition, the plurality of anode pads 14 in the pad formation region 21 in FIG. 6, the pads for electrical connection to the bumps formed on the front surface of the driver IC chip 10, and the pads for electrical connection to the flat type flexible cable 11 are formed.

Next, the interlayer insulation film 32 is formed on the formation substrate 61 (also see FIG. 10). On the interlayer insulation film 32, the opening part to expose the most of the surface of the light emission part 53 of each light emitting element 2, the opening parts 32a to expose the LMD 3 side end part of each of the anode connection wirings 31 (see FIG. 6), the opening parts 32b to expose the LMD 3 side end part of each of cathode connection wiring 34 (see FIG. 7), opening parts to expose the plurality of anode pads 14, opening parts to expose the pads connected to the driver IC chip 10, and opening parts to expose the pads for connected to the flat type flexible cable 11 are formed.

Then, the plurality of anode wirings 33 are formed on the interlayer insulation film 32 (see FIGS. 9 and 10). Each of the anode wirings 33 is in ohmic contact with the P-type semiconductor layer 55 of the light emitting element 2 corresponding thereto at the P contact part 55a, and is formed to be connected to the anode connection wiring 31 corresponding thereto via the opening part 32a (see FIGS. 6, 9 and 10). In addition, while the anode wirings 33 are formed, the plurality of cathode pads 15 on the pad formation regions 22a and 22b, and the plurality of pad connection wirings 37 are formed on the interlayer insulation film 32 (see FIGS. 6 and 7). One end of each of the pad connection wirings 37 is formed to be connected to the cathode pad 15 corresponding thereto. The other end of each of the pad connection wirings 37 is formed to be connected to the cathode wiring 36 corresponding thereto via the opening part 32b.

Next, the insulation layer (not illustrated) is formed on the entire surface of the formation substrate 61. The opening parts to expose the various pads (anode pads 14 and cathode pads 15 for light emitting element test, pads connected to the driver IC chip 10, and the pads for connected to the flat type flexible cable 11) are formed on the insulation layer.

In the above described processes, the formation method of the various wires and pads (electrode of light emitting elements 2, anode wirings 33, cathode wirings 36, anode connection wirings 31, cathode connection wirings 34, input signal connection wirings, anode pads 14 and cathode pads 15, pads connection to the driver IC chip 10, and the pads for connection to the flat type flexible cable 11) includes, for example, a method to form a conductive film that becomes wiring patterns by a vapor deposition and/or a sputtering, to pattern a resist by a photolithography technology, and to form wires by etching and a method to pattern a resist by the photolithography technology, to form a conductive film that becomes wiring patterns by the vapor deposition and/or the sputtering, and to pattern wires by removing the resist. Wiring materials may be formed of Au-based metal wirings composed of Au, Tu/Pt/Au, Ti/Au, AuGeNi/Au, AuGe/Ni/Au or the like, Al-based metal wirings composed of Al, Ni/A1, Ni/AlNd, Ni/AlSiCu, Ti/Al or the like, for example. Alternatively, an oxide-based transparent electrode such as ITO, ZnO or the like may be used.

In addition, various insulation films such as the insulation layer 56, the interlayer insulation film 32 and the like are formed of an inorganic-based insulation film composed of $SiO_2$, SiN, SiON, or the like, or an organic-based insulation film composed of polyimide, acrylic, amide-imide or the like. For formation of the inorganic-based insulation film, a method to form an insulation film by the chemical vapor deposition (CVD method) and/or the sputtering method, to pattern a resist by the photolithography technology, and to form patterns by etching is used, for example. For formation of the organic-based insulation film, a method to form an insulation film material by a spin coating method, a spray coating method, lamination with a laminator of a Dry Film Resist (DFR), or the like, to pattern the insulation film material to form patterns by the photolithography technology, and to bake at a predetermined temperature is used, for example.

The light emitting elements 2 are formed on a growth substrate (not illustrated) by performing patterning using crystal growth and semiconductor process. The matrix configuration of the light emitting elements 2 is formed on the formation substrate 61 by separating the formed light emitting elements 2 from the growth substrate, and laminating to the formation substrate 61. The light emitting elements 2 are formed of epitaxially grown LEDs composed of III-V group compound semiconductor material such as AlN, GaN, InN, InP, GaP, AlP, AlAs, GaAs or InAs (or mixed crystal thereof), or II-VI group compound semiconductor material such as ZnO, ZnSe or CdS, for example. Alternatively, it is possible to use organic-based material. The growth substrate is formed of Si, SiC, AlN, GaN, InN, InP, GaP, AlP, AlAs, GaAs, InAs, ZnO, and $Al_2O_3$ (sapphire), or the like.

<Bank Formation Process S2>

In bank formation process S2, the LMD protection part 5a, the dummy LMD protection part 5b, and the DFR that is a material of the bank 6 are laminated with a laminator on the formation substrate 61 on which the LMDs 3 are formed in preparation process S1.

Figure 13:
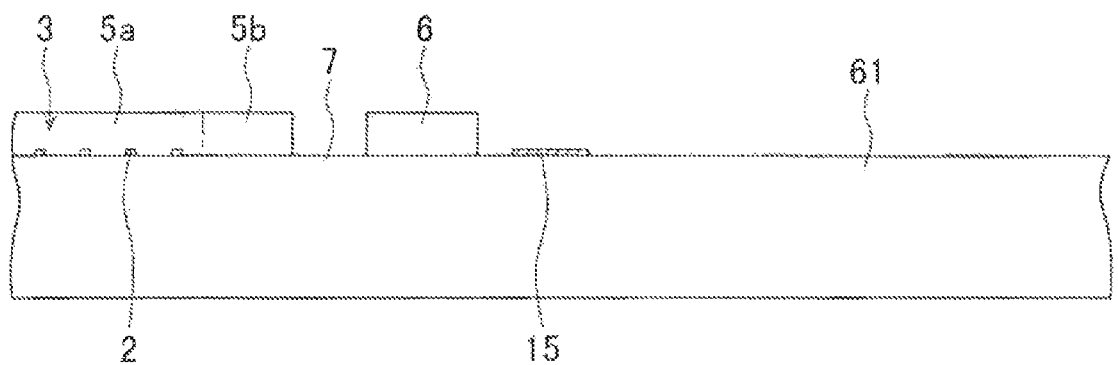
FIG. 13 explains each of the processes in FIG. 11.

Then, the laminated DFR is patterned using a photolithographic process. After the patterning, as illustrated in FIG. 13, the LMD protection part 5a, the dummy LMD protection part 5b and the bank 6 as well as the trench 7 are formed. In addition, the DFR of the non-LMD region (non-display region) that is outer than the bank 6 is removed. As described above, the LMD protection part 5a, the dummy LMD protection part 5b, the bank 6 and the trench 7 are formed at the same process.

The DFR is formed of a film-shaped photosensitive resin material composed of epoxy-based resin, silicon-based resin, acryl-based resin, amide-imide-based resin, or fluorine-based resin. The DFR is a film-shaped resist and is formed by, for example, coating photoresist resin to form a photoresist layer on a base film, drying the photoresist layer, and laminating a protective film onto the photoresist layer. The DFR has a trilaminar structure with the photoresist layer sandwiched between the base film and the protective film each having a thickness of 20 to 25 μm. The base film is preferably formed of biaxially-stretched PET (poly ethylene terephthalate) film which is flat and transparent and which has an excellent transmittance of ultraviolet rays. The protective film is preferably formed of LDPE (Low Density Polyethylene) film that has a suitable releasability from the photoresist layer of acryl-based resin and that has a high flatness with low fish eye.

<Light Emission Test Process S3>

A light emission test and electrical test are performed on the LMDs 3 using the plurality of anode pads 14 for test formed on the pad formation region 21 and the plurality of cathode pads 15 for test formed on the pad formation regions 22a and 22b at a wafer level before a chip is divided. The light emission test and electrical test are performed on the LMDs 3 in the following procedure, for example.

Respective probes for test contact the anode pads 14 and the cathode pads 15. A predetermined current is flown through the light emitting elements 2 arranged between the anode wirings 33 and the cathode wirings 36. The light emitting elements 2 emit light based on the current by the current flow. At this time, light amounts from the light emitting elements 2 and a voltage based on the current are measured, and a test is performed. In addition, light emission of light emitting elements 2 other than the target light emitting element 2 is checked.

In addition, a leak test between anode wirings 33 that are different from each other is performed by performing a test in which a voltage is applied between the anode wirings 33. In the same manner as described above, a leak test between cathode wirings 36 that are different from each other is performed.

Selection or ranking of the LMD 3 or the light emitting element 2 according to properties are performed in accordance with standards established in advance by these tests.

<Dicing Process S4>

FIG. 14 illustrates a schematic view during blade dicing. In dicing process S4, the formation substrate 61 is laminated on a tape frame 62. After that, the formation substrate 61 is cut with a dicing blade 63. Thereby, individually divided substrates 61a, 61b, and the like are obtained. After the individual division, each of the substrates is separated from the tape frame 62. Thereby, as illustrated in FIG. 15, the LMD 3, the LMD protection part 5a, the dummy LMD protection part 5b, the bank 6, the trench 7 and the substrate 1 on which wiring patterns (not illustrated) are formed are obtained.

<Anisotropic Conductive Film Process S5>

Anisotropic conductive film process S5 will be described with reference to FIG. 16. In anisotropic conductive film process S5, the driver IC chip 10 and the flat-type cable 11 are fixed to the substrate 1, and are electrically connected to the wiring patterns formed on the front surface of the substrate 1.

Specifically, the anisotropic conductive film 12 with a predetermined width is laminated on a region on which the driver IC chip 10 on the substrate 1 is affixed. After the lamination, gold bumps formed on a pattern surface of the driver IC chip 10 face the front surface of the substrate 1, are aligned face down so that wiring patterns on the driver IC chips 10 side match wiring patterns on the substrate 1 side, and are temporarily affixed at a predetermined temperature and pressure. Then, the gold bumps are permanently affixed at a predetermined temperature and pressure. During the affixing, a force is applied to the driver IC chip 10 in an allow X1 direction in FIG. 16.

Next, the anisotropic conductive film 13 with a predetermined width is laminated on a region on which the flat-type cable 11 on the substrate 1 is affixed. After the lamination, a conductive surface of the flat-type cable 11 faces the front surface of the substrate 1, is aligned face down so that wiring patterns on the flat-type cable 11 side match the wiring patterns on the substrate 1 side, and is temporarily affixed at a predetermined temperature and pressure. Then, the conductive surface is permanently affixed at a predetermined temperature and pressure. During the affixing, a force is applied to the flat-type cable 11 in an allow X2 direction in FIG. 16.

<Potting Process S6>

Potting process S6 will be described with reference to FIGS. 2 and 3. In potting process S6, a resin material for potting is dispensed on a region that is closer to the outer circumference side than the trench 7 using a dispenser. The dispensed resin material remains on each boundary (e.g. boundary between the bank 6 and the trench 7 on the top part of the bank 6, and the boundary between the surface and the outer circumference of the substrate 1) by surface tension. In order to effectively dispense, a resin material with an approximately 1 to 20 cP viscosity is preferably used. The resin material is a liquid resin material composed of epoxy-based resin, silicon-based resin, acryl-based resin, amide-imide-based resin, or fluorine-based resin.

Then, the resin material is dried to form the outer circumference protection part 16. When ultraviolet (UV) curable resin is used for the resin material, the resin material is dried by UV irradiation. When thermoset resin is used, the thermoset resin is heated by a baking furnace, a hot plate, or the like to be dried. When room temperature curable resin is used, the room temperature curable resin is left at room temperature for a predetermined period of time to be dried.

<Cable Protection Process S7>

Cable protection process S7 will be described with reference to FIG. 3. A resin material for cable protection is dispensed between the back surface of the flat-type cable 11 (lower side in FIG. 3) and the side surface of the substrate 1 using a dispenser. The resin material is dispensed in a shape that covers the anisotropic conductive film 13 and the wiring patterns of the flat-type cable 11. The anisotropic conductive film 13 and the flat-type cable 11 extend out of the substrate 1. The resin material is a liquid resin material composed of epoxy-based resin, silicon-based resin, acryl-based resin, amide-imide-based resin, or fluorine-based resin.

After the dispensing, the resin material is dried to form the cable protection part 17. When UV curable resin is used for the resin material, the resin material is dried by UV irradiation. When thermoset resin is used, the thermoset resin is heated by a baking furnace, a hot plate, or the like to be dried. When room temperature curable resin is used, the room temperature curable resin is left at room temperature for a predetermined period of time to be dried.

[Operation of Display Module]

Next, an operation of the DM 100 according to the first embodiment will be described with reference to FIG. 8.

When display information is input to the display control part 40, an external control circuit or the like, the display control part 40 supplies the anode drive signal based on the display information to the anode driver 41. Then, the light-emission data for the respective light emitting elements 2 of the LMD 3 of the first row are stored sequentially in the shift resistor of the anode driver 41. The light-emission data stored in the shift register are converted into parallel light-emission data by the shift register, and stored in the latch circuit in the anode driver 41. A constant electric current from the constant current circuit to be supplied to the respective light emitting elements 2 via the anode wirings 33 by outputs of the latch circuit and output enable signals.

At this time, when the cathode drive signals supplied from the display control part 40 are input to the cathode drivers 42a and 42b, the selector circuits of the cathode drivers 42a and 42b select the cathode wiring 36 of the LMD 3 of the first row. Thereby, a driving current is supplied to the light emitting elements 2 of the first row from the anode wiring 33 of the LMD 3 of the first row. That is, the respective light emitting elements 2 of the first row emit light based on the light-emission data. This light emission test process is repeated by the number of the cathode wirings 36 (i.e., the number of rows of the light emitting elements 2), and image light of one screen containing information to be displayed is emitted. The light is emitted outside from the respective light emitting elements 2 via the LMD protection part 5a.

[Functions]

Next, functions of the DM 100 according to the first embodiment will be described.

The LMD 3 is protected against humidity, damage, and contamination since the LMD 3 is covered with the LMD protection part 5a.

The plurality of wirings, the plurality of pads, the anisotropic conductive films 12 and 13, the driver IC chip 10 and the one end part of the flat-type cable 11 formed on the substrate 1 are protected against humidity, damage, and contamination by the outer circumference protection part 16. Moreover, the outer circumference protection part 16 has a function to improve an intensity to fix the driver IC chip 10 and the flat-type cable 11 to the substrate 1.

The anisotropic conductive film 13 and the wiring patterns of the flat-type cable 11 are protected against humidity, damage, and contamination by the cable protection part 17 formed between the back surface of flat-type cable 11 and the side surface of the substrate 1. Moreover, the cable protection part 17 has a function to improve an intensity to fix the flat-type cable 11 to the substrate 1.

In potting process S6, when the outer circumference part of the display region 4 is sealed, the bank configuration and the trench configuration prevent the resin material from entering the display region 4.

[Effects]

According to the present first embodiment described above, the effects (1) to (11) described below are obtained.

(1) In the present embodiment, the bank is provided on the substrate at the position separated by the predetermined distance from the outer circumferential edge of the display region to seal a region on the bank and the outer circumferential region of the bank using the potting. The bank encloses at least the part of the outer circumferential edge of the display region. Therefore, according to the present invention, the outer circumferential region of the display region is sealed using the potting while entrance of the potting material into the display region is prevented.

Thereby, the potting is performed only on the outer circumferential region without a size of the display module (chip size) increased, for example. Specifically, an alternative method to prevent the entrance of the potting material into the display region sufficiently enlarges the outer circumferential region (frame area) of the display region. The method unnecessarily increases the size of the display module. On the other hand, according to the present embodiment, the potting is performed only on the outer circumferential region without a size of the display module increased.

(2) The display region is sealed using a resin material and the outer circumferential region thereof is sealed using another resin material by the bank.

(3) Elements provided on the outer circumferential region of the display region on the substrate (e.g. wirings, pads, anisotropic conductive films, drive circuit, the cable and the like) are protected against humidity, damage, and contamination by sealing the outer circumferential region of the display region using the potting.

(4) The display region is substantially rectangular from a plan view. The bank includes the two facing parts that face the two sides of the display region that are adjacent to the facing parts and the linkage part that links the two facing parts. The linkage parts are configured to smoothly link the two facing parts. According to the present embodiment, during potting, the prevention of the entrance of the potting material from the linkage part (corner parts of the bank) is more ensured.

(5) In the case when a cover is attached to the substrate to protect the outer circumferential region of the display region, the display module can be damaged during the attachment of the cover. On the other hand, in the present embodiment, the display module does not be damaged unlike the above-described case since the outer circumferential region of the display region is protected using the potting.

(6) The display region is protected against humidity, damage, and contamination since the protection parts are formed on the display region.

(7) The protection parts with high uniformity in surface thickness are formed by using the DFR for the protection of the display region. Therefore, a phenomenon in which a displayed image bends and the like hardly occurs.

(8) The phenomenon in which the edge parts of the display region are abnormally illuminated is prevented since the protection parts formed on the display region extend to the outer circumferential region of the display region.

(9) A thickness of the display module is thinned in comparison with the case when the cover is attached to the substrate to protect the display region since the display region is protected (by the DFR) without the cover.

(10) A size of the frame area is suppressed in comparison with the case when the cover is attached to the substrate to protect the display region since the display region is protected (by the DFR) without the cover.

(11) A thermal resistance is reduced between a heat resource on the substrate such as the light emitting elements, drive circuits and the like and a release member such as the heat sink, the housing or the like since the release member may directly be provided on the backside of the substrate. Thereby, heat generated from the heat source is effectively transferred to the release member to be released.

Second Embodiment

Figure 17:
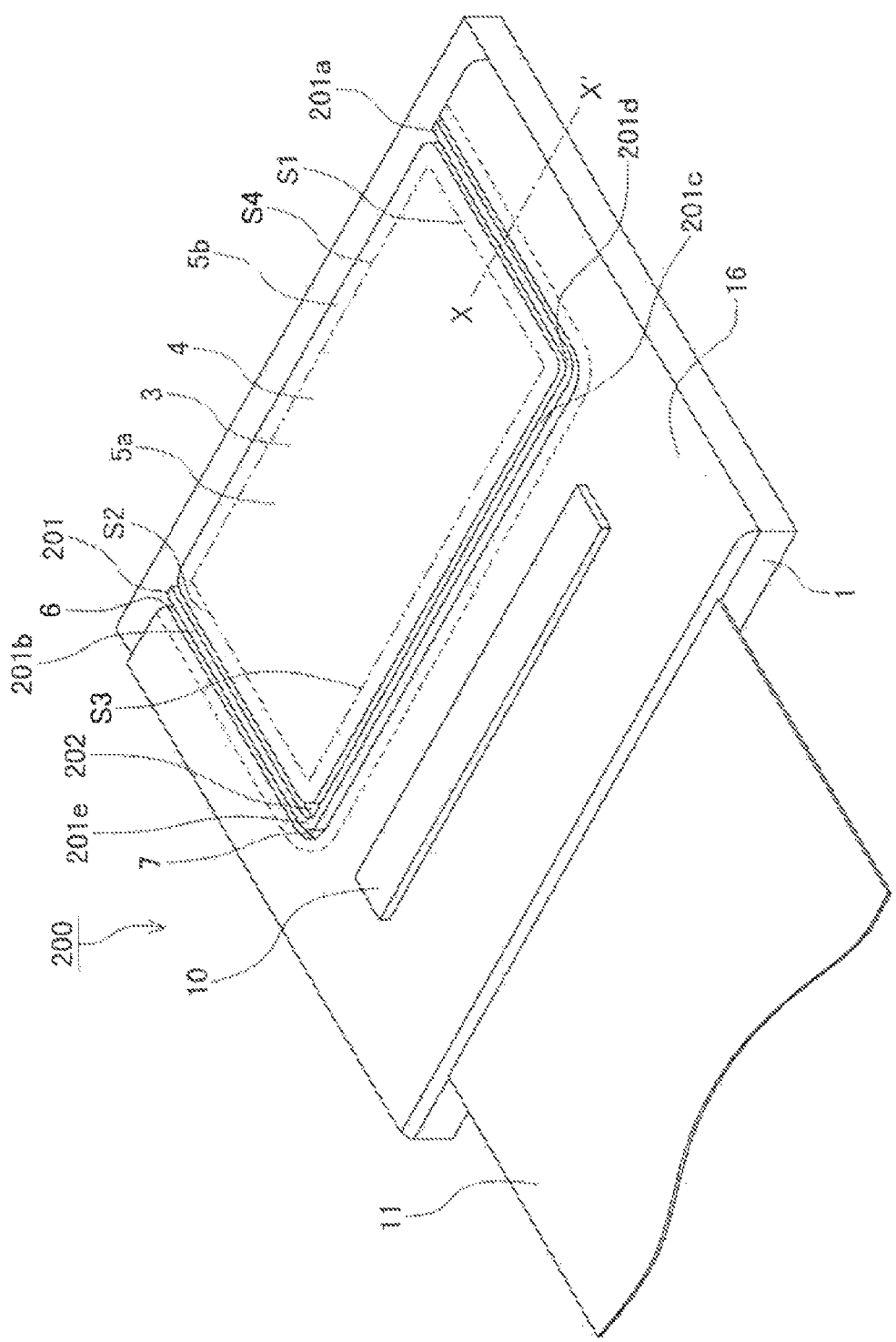
FIG. 17 is an external perspective view of an entire DM according to a second embodiment.
Figure 18:
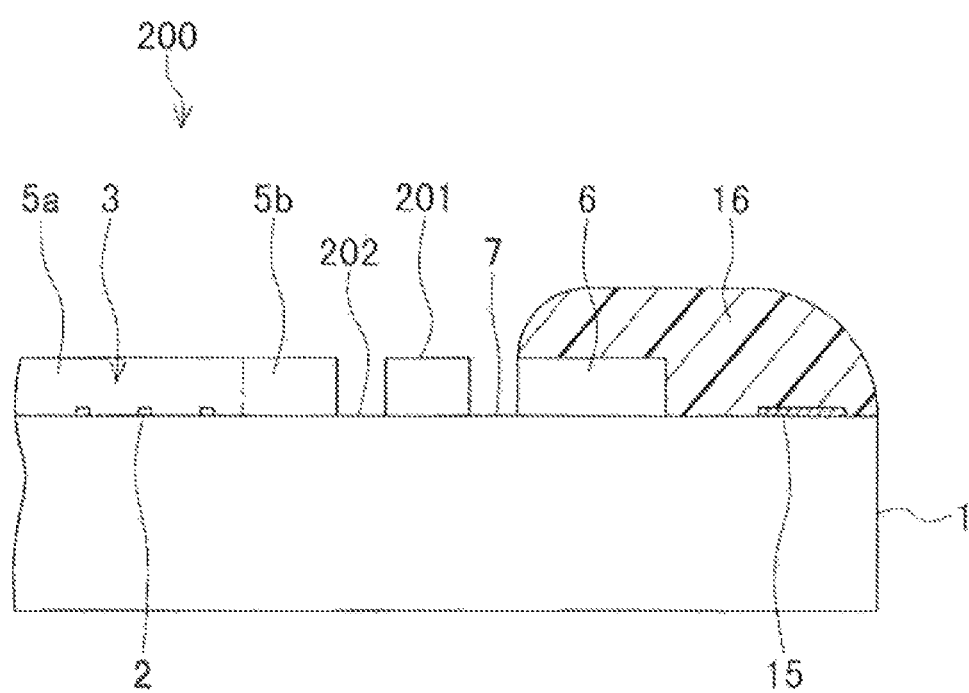
FIG. 18 is a cross-sectional view along a broken line X-X' in FIG. 17.

FIG. 17 is an external perspective view of an entire DM 200 according to a second embodiment. FIG. 18 is a cross-sectional view along a broken line X-X' in FIG. 17. A configuration of a bank of the DM 200 is different from that of the DM 100 in the first embodiment. Parts other than the configuration are substantially same as the first embodiment. In the description below, duplicative explanations on parts that are the same as the first embodiment are simplified or omitted, and elements that are the same as or corresponding to the first embodiment are indicated with the same symbols.

As illustrated in FIGS. 17 to 18, the DM 200 includes the substrate 1 in the same manner as the first embodiment. The LMD 3 configured by the plurality of light emitting elements 2, the LMD protection part 5a, the dummy LMD protection part 5b, the bank 6, the driver IC chip 10, the flat-type cable 11, the various wirings, the various pads (e.g. cathode pads 15) and the outer circumference protection part 16 are provided on the substrate 1.

In the present embodiment, a second bank 201 is provided on the front surface of the substrate 1 at a position between the dummy LMD protection part 5b and the bank 6 and separated by a predetermined distance from both of them. The second bank 201 encloses at least a part of the outer circumferential edge of the dummy LMD protection part 5b. A second trench 202 is formed between the dummy LMD protection part 5b and the second bank 201. The trench 7 is formed between the bank 6 and the second bank 201. That is, the second trench 202 and the second bank 201 are formed on the outer circumference of the dummy LMD protection part 5b. The second trench 202 is a second boundary groove. The trench 7 is formed on an outer circumference of the second bank 201. The trench 7 is a first boundary groove. The bank 6 is formed on the outer circumference of the trench 7 that is the boundary. The outer circumference protection part 16 is formed on the bank 6 and on an outer circumferential region of the bank 6, that is, an outer circumferential region of the trench 7.

In the same manner as the first embodiment, the display region 4 is substantially rectangular from a plan view, and includes the right side S1, the left side S2, the lower side S3 and the upper side S4. Then, the second bank 201 is provided to enclose the three sides S1 to S3 of the four sides of the display region 4 (or dummy LMD protection part 5b) excluding the predetermined side (upper side S4). Specifically, the second bank 201 includes facing parts 201a and 201b (fourth and fifth facing parts) that face the first and second sides S1 and S2 of the displaying region that are opposing from each other, S1 and S2 being two of the three sides S1 to S3, a facing part 201c (sixth facing part) that faces the third side S3 of the display region that extends between S1 and S2, a linkage part 201d (third linkage part) that links the facing part 201a and the facing part 201c, and a linkage part 201e (fourth linkage part) that links the facing part 201b and the facing part 201c. The example in FIG. 17, the facing parts 201a, 201b and 201c are in a linear shape. The linkage parts 201d and 201e are configured to smoothly link the facing part 201a to the facing part 201c and the facing part 201b to the facing part 201c, respectively. Specifically, the linkage parts 201d and 201e are formed in an arc shape to be convex from a plan view. That is, the second bank 201 is formed to be curved at corner parts from a plan view.

A manufacturing method of the DM 200 in the present embodiment has the same processes as those of the DM 100 in the first embodiment. The second bank 201 and the second trench 202 that are characteristic configurations in the present embodiment are formed in the same process as that of the LMD protection part 5a, the dummy LMD protection part 5b, the bank 6 and the trench 7. In the present embodiment, in bank formation process S2, the LMD protection part 5a, the dummy LMD protection part 5b, the bank 6, the trench 7, the second bank 201 and the second trench 202 are formed by laminating the DFR on the formation substrate 61 on which the LMDs 3 are formed and patterning the DFR using a photolithographic process, for example.

The operation and the functions of the DM 200 according to the present embodiment are same as those of the DM 100 according to the first embodiment. The following functions are added to the present embodiment.

In potting process S6, the second bank 201 and the second trench 202 prevent the resin material from entering into the display region 4 even if the resin material flows over the bank 6 and the trench 7 and enters into the display region 4 side.

According to the present embodiment, the following effects are obtained as well as the above-described effects of the first embodiment.

In the present embodiment, the second bank is provided on the substrate at the position between the display region and the bank and separated by the predetermined distance from both of them. The second bank encloses at least the part of the outer circumferential edge of the display region. Thereby, the prevention effect for the entrance of the potting material into the display region is enhanced.

In addition, the second bank is formed in the same process as the bank without adding a process, and the prevention effect for the entrance of the potting material into the display region is enhanced.

Third Embodiment

Figure 19:
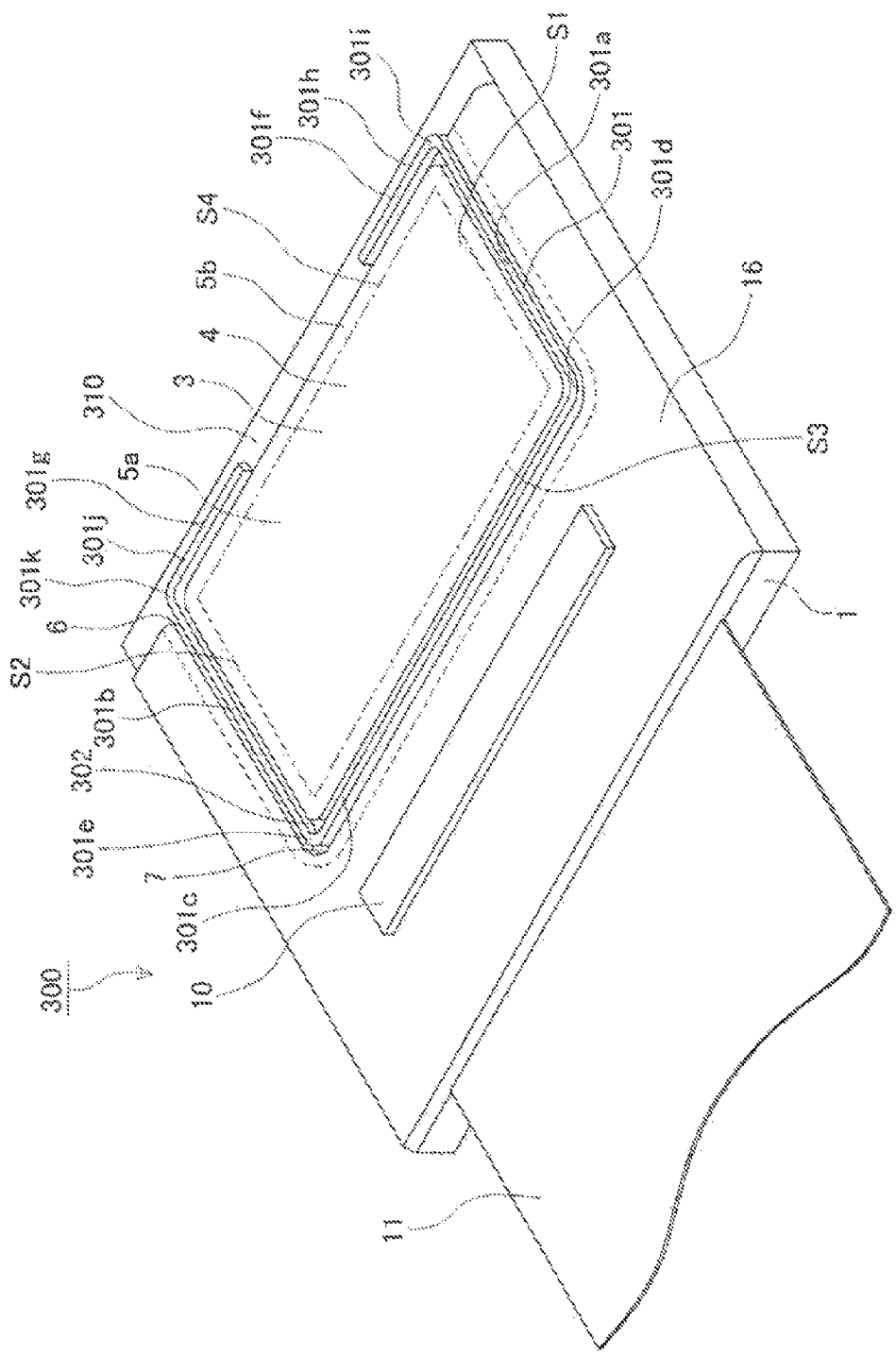
FIG. 19 is an external perspective view of an entire DM according to a third embodiment.

FIG. 19 is an external perspective view of the DM 300 according to a third embodiment. A configuration of a bank of the DM 300 is different from that of the DM 100 in the first embodiment. Parts other than the configuration are substantially same as the first embodiment. In the description below, duplicative explanations on parts that are the same as the first embodiment are simplified or omitted, and elements that are the same as or corresponding to the first embodiment are indicated with the same symbols.

As illustrated in FIG. 19, the DM 300 includes the substrate 1 in the same manner as the first embodiment. The LMD 3 configured by the plurality of light emitting elements 2, the LMD protection part 5a, the dummy LMD protection part 5b, the bank 6, the driver IC chip 10, the flat-type cable 11, the various wirings, the various pads and the outer circumference protection part 16 are provided on the substrate 1.

In the present embodiment, a second bank 301 is provided on the surface of the substrate 1 at a position between the dummy LMD protection part 5b and the bank 6 and separated by a predetermined distance from both of them. The second bank 301 encloses at least a part of the outer circumferential edge of the dummy LMD protection part 5b. A second trench 302 is formed between the dummy LMD protection part 5b and the second bank 301. The trench 7 is formed between the bank 6 and the second bank 301. That is, the second trench 302 and the second bank 301 are formed on the outer circumference of the dummy LMD protection part 5b. The second trench 302 is a second boundary groove. The trench 7 is formed on an outer circumference of the second bank 301. The trench 7 is a first boundary groove. The bank 6 is formed on the outer circumference of the trench 7 that is the boundary. The outer circumference protection part 16 is formed on the bank 6 and on an outer circumferential region of the bank 6, that is, an outer circumferential region of the trench 7.

In the same manner as the first embodiment, the display region 4 is substantially rectangular from a plan view, and includes the right side S1, the left side S2, the lower side S3 and the upper side S4. Then, the second bank 301 is provided to enclose the three sides S1 to S3 of the four sides of the display region 4 (or dummy LMD protection part 5b) excluding the predetermined side (upper side S4). Specifically, the second bank 301 includes facing parts 301a and 301b (fourth and fifth facing parts) that face the first and second sides S1 and S2 of the displaying region that are opposing from each other, S1 and S2 being two of the three sides S1 to S3, a facing part 301c (sixth facing part) that faces the third side S3 of the display region that extends between S1 and S2, a linkage part 301d (third linkage part) that links the facing part 301a and the facing part 301c, and a linkage part 301e (fourth linkage part) that links the facing part 301b and the facing part 301c.

Moreover, extension parts 301f and 301g are arranged on an upper region of the DM 300, and extend from the facing parts 301a and 301b, respectively. Specifically, the second bank 301 includes the extension parts 301f and 301g. The extension parts 301f and 301g, respectively, extend from the facing parts 301a and 301b, and bend inwardly to enclose an outer circumferential region 310 out of the predetermined side (upper side S4) of the display region 4. The extension part 301f includes a facing part 301h facing the upper side S4 and a linkage part 301i linking the facing part 301h and the facing part 301a. The extension part 301g includes a facing part 301j facing the upper side S4 and a linkage part 301k linking the facing part 301j and the facing part 301b.

The example in FIG. 19, the facing parts 301a, 301b, 301c, 301h, and 301j are in a linear shape. The linkage parts 301d, 301e, 301i, and 301k are configured to smoothly link the facing part 301a to the facing part 301c, the facing part 301b to the facing part 301c, the facing part 301a to the facing part 301h, and the facing part 301b to the facing part 301j, respectively. Specifically, the linkage parts 301d, 301e, 301i and 301k are formed in an arc shape to be convex from a plan view. That is, the second bank 301 is formed to be curved at corner parts from a plan view.

A manufacturing method of the DM 300 in the present embodiment has the same processes as those of the DM 100 in the first embodiment. The second bank 301 and the second trench 302 that are characteristic configurations in the present embodiment are formed in the same process as that of the LMD protection part 5a, the dummy LMD protection part 5b, the bank 6 and the trench 7. In the present embodiment, in bank formation process S2, the LMD protection part 5a, the dummy LMD protection part 5b, the bank 6, the trench 7, the second bank 301 and the second trench 302 are formed by laminating the DFR on the formation substrate 61 on which the LMDs 3 are formed and patterning the DFR using a photolithographic process, for example.

The operation and the functions of the DM 300 according to the present embodiment are same as those of the DM 100 according to the first embodiment. The following functions are added to the present embodiment.

In potting process S6, the second bank 301 and the second trench 302 prevent the resin material from entering into the display region 4 even if the resin material flows over the bank 6 and the trench 7 and enters into the display region 4 side.

Moreover, in potting process S6, the extension parts 301f and 301g of the second bank 301 prevent the resin material from entering the display region 4 from the upper side of the DM 300.

According to the present embodiment, the following effects are obtained as well as the above-described effects of the first embodiment.

In the present embodiment, the second bank is provided on the substrate at the position between the display region and the bank and separated by the predetermined distance from both of them. The second bank encloses the three sides of the display region excluding the predetermined side. Thereby, the prevention effect for the entrance of the potting material into the display region is enhanced.

In addition, the second bank includes the two extension parts. The extension parts extend to enclose the outer circumferential region of the display region adjacent to the predetermined side. Thereby, the prevention effect for the entrance of the potting material from the predetermined side (e.g. upper side S4) is enhanced.

In addition, the second bank is formed in the same process as the bank without adding a process, and the prevention effect for the entrance of the potting material into the display region is enhanced.

Fourth Embodiment

Figure 20:
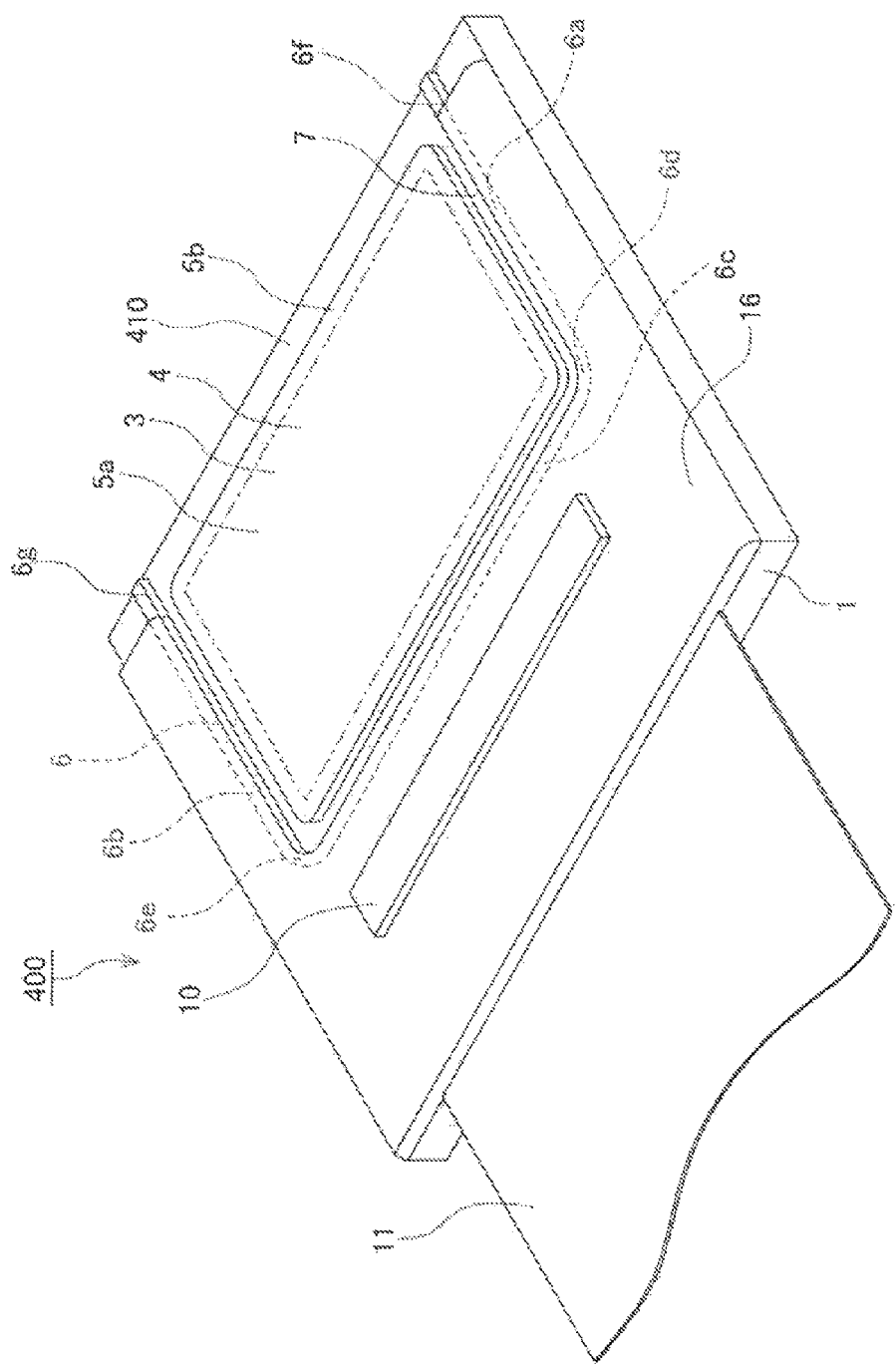
FIG. 20 is an external perspective view of an entire DM according to a fourth embodiment.

FIG. 20 is an external perspective view of an entire DM 400 according to a fourth embodiment. A configuration of a bank of the DM 400 is different from that of the DM 100 in the first embodiment. Parts other than the configuration are substantially same as the first embodiment. In the description below, duplicative explanations on parts that are the same as the first embodiment are simplified or omitted, and elements that are the same as or corresponding to the first embodiment are indicated with the same symbols.

As illustrated in FIG. 20, the DM 400 includes the substrate 1 in the same manner as the first embodiment. The LMD 3 configured by the plurality of light emitting elements 2, the LMD protection part 5a, the dummy LMD protection part 5b, the bank 6, the trench 7, the driver IC chip 10, the flat-type cable 11, the various wirings, the various pads and the outer circumference protection part 16 are provided on the substrate 1.

In the same manner as the first embodiment, the display region 4 is substantially rectangular from a plan view, and includes the right side S1, the left side S2, the lower side S3 and the upper side S4. Then, the bank 6 includes facing parts the 6a, 6b and 6c and linkage parts the 6d and 6e.

In the present embodiment, extension parts 6f and 6g are arranged on an upper region of the DM 400, and extend from the facing parts 6a and 6b, respectively. Specifically, the bank 6 includes the extension parts 6f and 6g. The extension parts 6f and 6g, respectively, linearly extend from the facing parts 6a and 6b to enclose an outer circumferential region 410 of the display region 4 adjacent to the predetermined side (upper side S4).

A manufacturing method of the DM 400 in the present embodiment has the same processes as those of the DM 100 in the first embodiment. The extension parts 6f and 6g that are characteristic configurations in the present embodiment are formed in the same process as that of the LMD protection part 5a, the dummy LMD protection part 5b, the bank 6 and the trench 7. In the present embodiment, in bank formation process S2, the LMD protection part 5a, the dummy LMD protection part 5b, the bank 6 including the extension parts 6f and 6g, and the trench 7 are formed by laminating the DFR on the formation substrate 61 on which the LMDs 3 are formed and patterning the DFR using a photolithographic process, for example.

The operation and the functions of the DM 400 according to the present embodiment are same as those of the DM 100 according to the first embodiment. The following functions are added to the present embodiment.

In potting process S6, the extension parts 6f and 6g prevent the resin material from entering the display region 4 from the upper side of the DM 400.

According to the present embodiment, the following effects are obtained as well as the above-described effects of the first embodiment.

In the present embodiment, the bank includes the two extension parts. The extension parts linearly extend to enclose the outer circumferential region of the display region adjacent to the predetermined side. Thereby, the prevention effect for the entrance of the potting material from the predetermined side (e.g. upper side S4) is enhanced.

In addition, the extension parts are formed in the same process as the other parts of the bank without adding a process, and the prevention effect for the entrance of the potting material into the display region is enhanced.

Fifth Embodiment

[Configuration of Display Apparatus]

Figure 21:
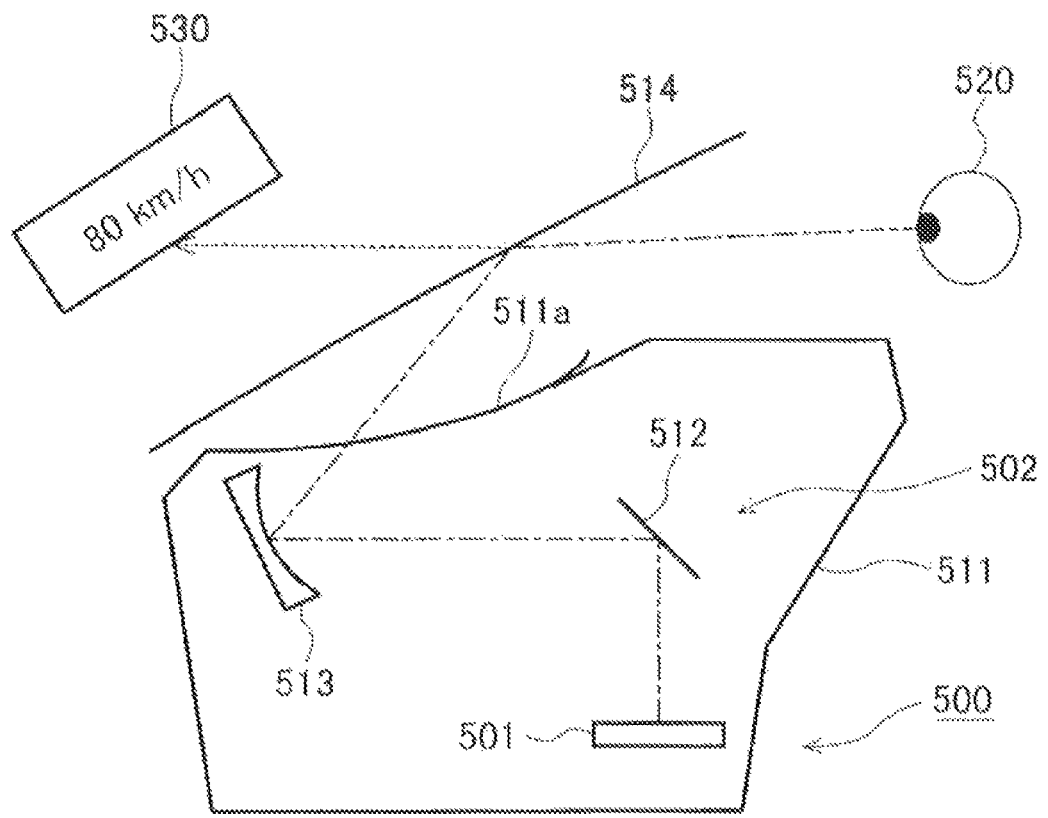
FIG. 21 is a schematic configuration diagram of a configuration of a display apparatus according to a fifth embodiment.

FIG. 21 is a schematic configuration diagram of a configuration of a display apparatus 500 according to a fifth embodiment. The display apparatus 500 is a projection type display apparatus using the DM according to the first to fourth embodiments. The display apparatus 500 is, for example, an HUD (Head Up Display) provided in a vehicle, aircraft or the like. The display apparatus 500 is configured to display various kinds of information such as display information by various indicators such as a speed meter or fuel meter, map information by a navigation system, image information obtained by an imaging device, or the like.

In FIG. 21, the display apparatus 500 includes the DM 501 of any of the first to fourth embodiments and an optical system 502. The optical system 502 projects the light emitted by the DM 501 on a predetermined place (here, semitransparent mirror) to display an image on the predetermined place.

Specifically, the display apparatus 500 includes a housing 511. The housing 511 includes a window 511a on a top surface thereof. The housing 511 is mounted to a backside of an instrument panel of the vehicle, for example. The display panel DM 501 is arranged to a lower part of the housing 511. In the housing 511, the optical system 502 is provided above the DM 501, and projects light of the image emitted by the DM 501. The optical system 502 includes a reflection plane mirror 512 and an enlargement concave mirror 513. The reflection plane mirror 512 reflects the light of the image emitted by the DM 501 in a predetermined direction (for example, substantially in a horizontal direction). The enlargement concave mirror 513 is arranged on a reflection side of the reflection plane mirror 512. The enlargement concave mirror 513 focuses the light from the reflection plane mirror 512 on an above windshield plate 514 (W/S, i.e., semitransparent mirror) via the window 511a of the housing 511, so as to form an image on the windshield plate 514 in an enlarged scale.

[Operation of Display Apparatus]

When the display control part 40 of the DM 501 receives information to be displayed in the display apparatus 500, the display control part 40 supplies the anode drive signal based on the display information to the anode driver 41 of the DM 501, and supplies the cathode drive signal to the cathode drivers 42a and 42b (FIG. 8) of the DM 501. With this, the light emitting elements 2 of the DM 501 emit light, and the light of the image containing the display information is emitted via the LMD protection part 5a.

As illustrated in FIG. 21, the light emitted by the DM 501 is reflected by the reflection plane mirror 512, is enlarged by the concave mirror 513, and is incident on the windshield plate 514. With this, a virtual image 530 of the image formed by the light emitted by the DM 501 on a front side of the windshield plate 514 in a sight of a driver 520 is displayed. Thereby, the driver 520 can see various kind of information contained in the image formed by the light emitted by the DM 501 while keeping eyes on the front side.

[Manufacturing Method of Display Apparatus]

The manufacturing method of the display apparatus 500 includes manufacturing the DM 501 and providing the optical system 502 that projects the light emitted by the manufactured DM 501 on the predetermined place to display an image on the predetermined place. The process manufacturing the DM 501 is the same as those of the first to fourth embodiments.

[Effects]

The display apparatus according to the present invention uses the display module of the first to fourth embodiments. According to the present embodiment, a downsized projection type display apparatus (e.g. HUD) with a simple configuration is realized since the display module is configured by a self-luminous type light emitting element array.

Sixth Embodiment

Figure 22:
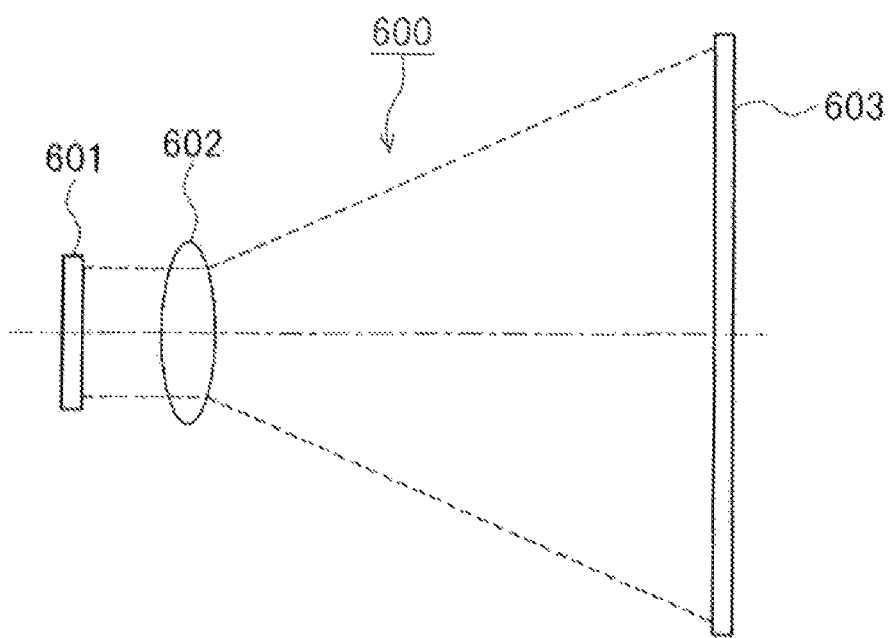
FIG. 22 is a schematic configuration diagram of a configuration of a display apparatus according to a sixth embodiment.

FIG. 22 is a schematic configuration diagram of a configuration of a display apparatus 600 according to a sixth embodiment. The display apparatus 600 is a front-projection type display apparatus using the DMs according to the first to fourth embodiments, and is a front-projection type projector, for example.

In FIG. 22, the display apparatus 600 includes the DM 601 of any of the first to fourth embodiments and an optical system (here, projection lens 602). The optical system projects the light emitted by the DM 601 on a predetermined place (here, screen 603) to display an image on the predetermined place.

In the display apparatus 600, the light emitted by the DM 601 is projected on the front screen 603 via the projection lens 602 so that an image is formed on the screen 603 in an enlarged scale.

The manufacturing method of the display apparatus 600 according to the sixth embodiment is the same as the fifth embodiment. In addition, the substantially same effect as the fifth embodiment is obtained according to the sixth embodiment.

Seventh Embodiment

Figure 23:
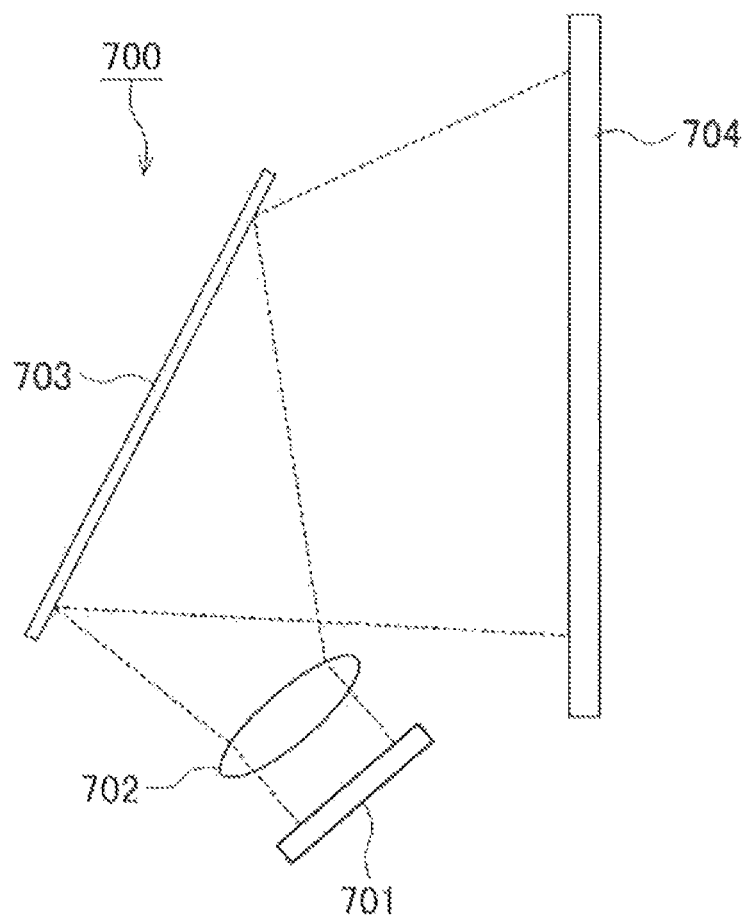
FIG. 23 is a schematic configuration diagram of a configuration of a display apparatus according to a seventh embodiment.

FIG. 23 is a schematic configuration diagram of a configuration of a display apparatus 700 according to a seventh embodiment. The display apparatus 700 is a rear-projection type display apparatus using the DMs according to the first to fourth embodiments, and is a rear-projection type projector, for example.

In FIG. 23, the display apparatus 700 includes the DM 701 of any of the first to fourth embodiments and an optical system (here, projection lens 702 and reflection mirror 703). The optical system projects the light emitted by the DM 701 on a predetermined place (here, screen 704) to display an image on the predetermined place.

In the display apparatus 700, the light emitted by the DM 701 is reflected by the projection lens 702 and the reflection mirror 703 to the screen 704 so as to project an image on the screen 704 in an enlarged scale from backside.

The manufacturing method of the display apparatus 700 according to the seventh embodiment is the same as the fifth embodiment. In addition, the substantially same effect as the fifth embodiment is obtained according to the seventh embodiment.

Eighth Embodiment

Figure 24:
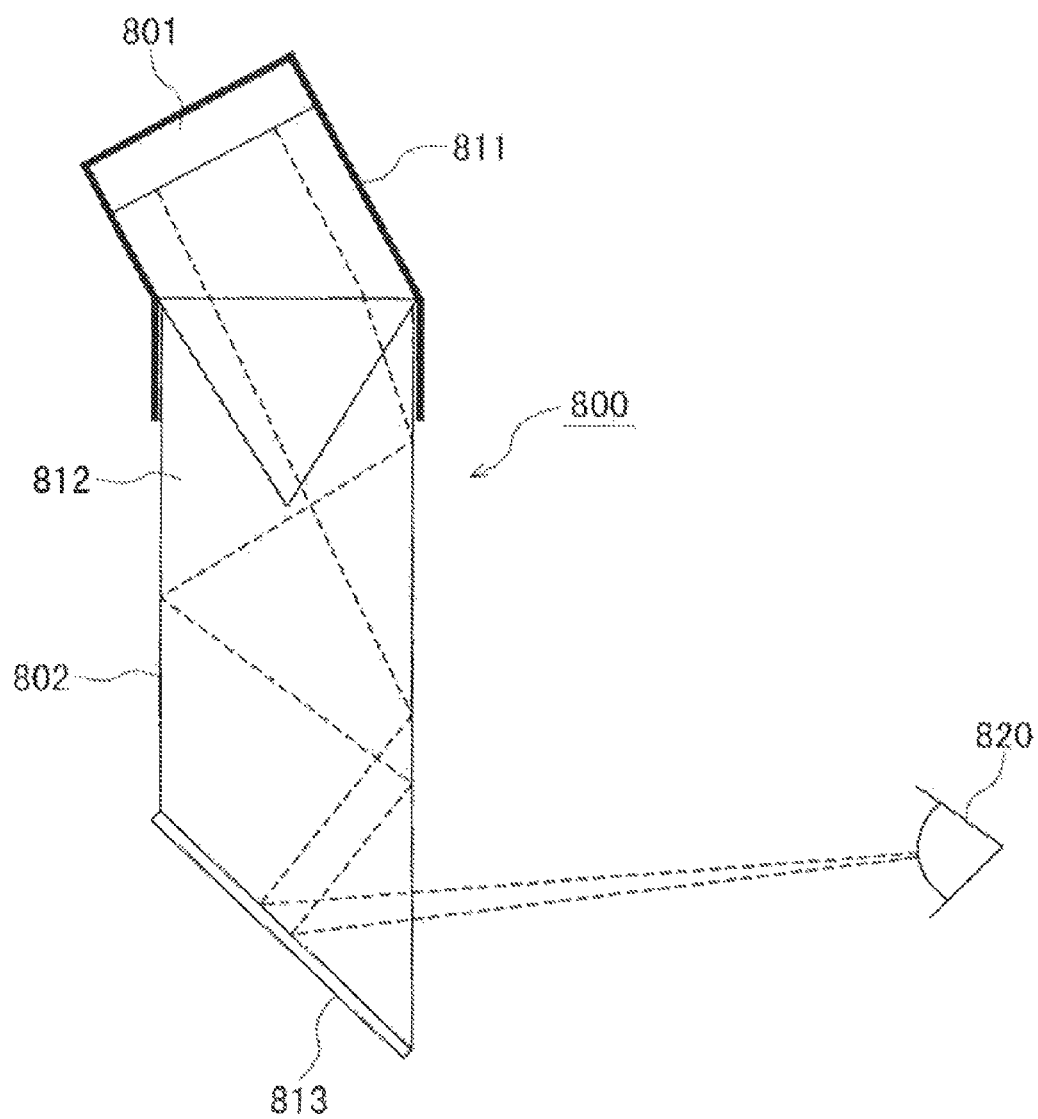
FIG. 24 is a schematic configuration diagram of a configuration of a display apparatus according to an eighth embodiment.

FIG. 24 is a schematic configuration diagram of a configuration of a display apparatus 800 according to an eighth embodiment. The display apparatus 800 is a display apparatus using the DMs according to the first to fourth embodiments, and is a head mount display (HMD) mounted to eyeglasses, for example.

In FIG. 24, the display apparatus 800 includes the DM 801 of any of the first to fourth embodiments and an optical system (here, eyepiece optical system 802). The optical system projects the light emitted by the DM 801 on a predetermined place (here, hologram optical element 813) to display an image on the predetermined place.

Specifically, the display apparatus 800 includes a housing 811 and a DM 801 accommodated in a housing 811. The eyepiece optical system 802 is attached to the housing 811. The eyepiece optical system 802 includes, for example, a prism 812 and the sheet-like hologram optical element 813 mounted to a lower end of the prism 812.

In the display apparatus 800, the light emitted by the DM 801 is incident on the prism 812, reflected inside the prism 812, and reaches the hologram optical element 813 provided at the lower end of the prism 812. The hologram optical element 813 causes interference of lights and forms a virtual image viewable by an eye 820 of a user. Therefore, the user is able to view the image formed by the light emitted by the DM 801.

The manufacturing method of the display apparatus 800 according to the eighth embodiment is the same as the fifth embodiment. In addition, the substantially same effect as the fifth embodiment is obtained according to the eighth embodiment.

MODIFICATIONS

The DMs and/or the display apparatuses in the above-described first to eight embodiments may be modified as follows.

<First Modification>

In the first to third embodiments, the bank 6 may be formed to enclose the entire outer circumferential edge of the display region 4. In the first to third embodiments, the bank 6 is not formed at the upper side part of the DM. However, the bank 6 may be formed to be linked the upper side part of the DM, for example. In the modification, the same effects as the first to third embodiments are obtained.

<Second Modification>

In the second and third embodiments, the second bank may be formed to enclose the entire outer circumferential edge of the display region 4. In the embodiment 3, the extension parts 301*f* and 301*g* are separated. However, both of them may be configured to be linked so that the second bank 301 encloses the entire outer circumferential edge of the display region 4, for example. In the modification, the same effects as the second and third embodiments are obtained.

<Third Modification>

Moreover, in the second modification, the bank 6 may be formed to enclose the entire outer circumferential edge of the display region 4. That is, the DM may be configured so that both of the bank 6 and the second bank 301 may be configured to enclose the entire outer circumferential edge of the display region 4. In the modification, the same effects as the second and third embodiments are obtained.

<Fourth Modification>

Figure 25:
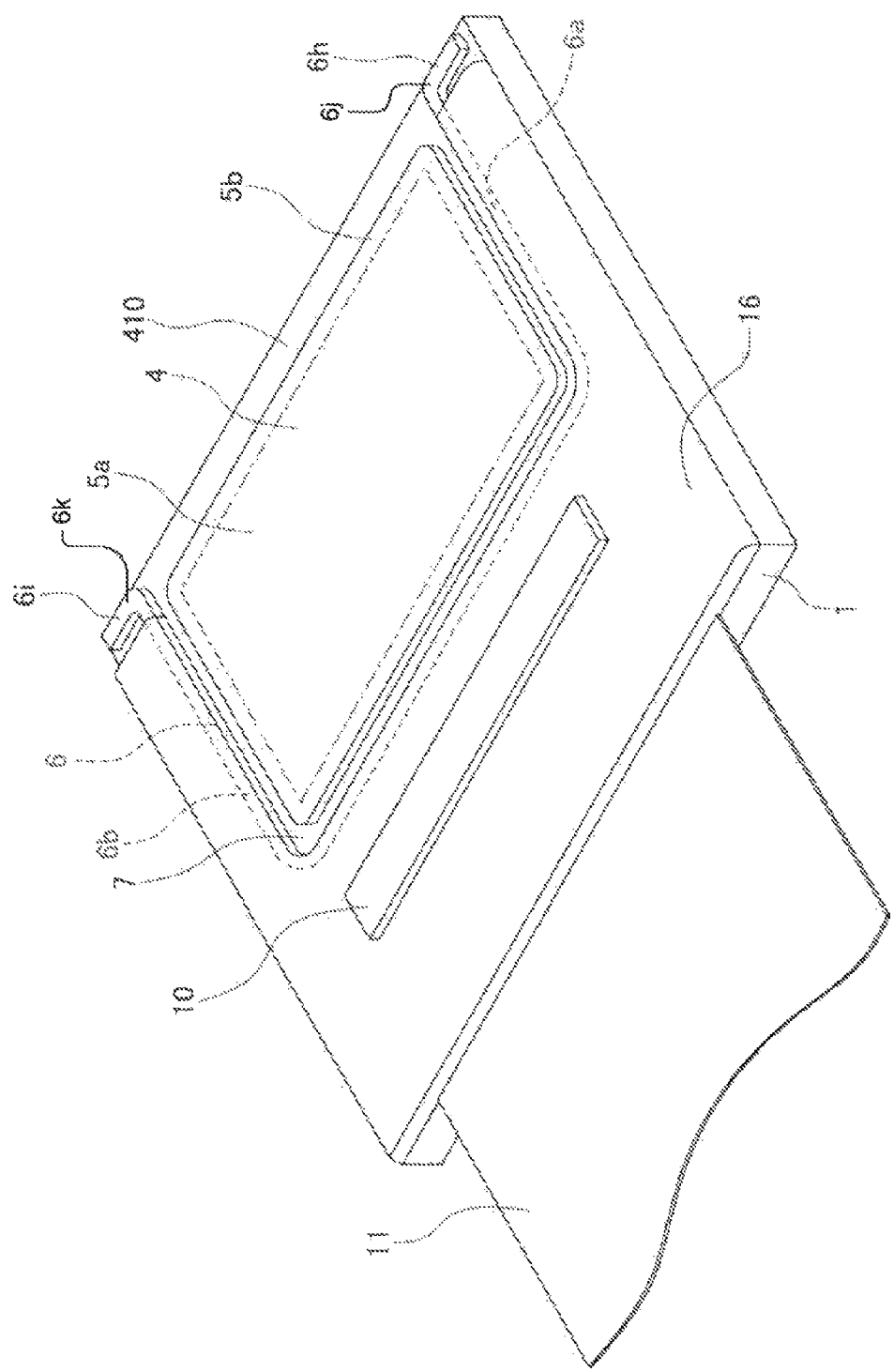
FIG. 25 is an external perspective view of an entire DM according to a fourth modification example of the first to eighth embodiments.

In the fourth embodiment, as illustrated in FIG. 25, the bank 6 may be configured to include two extension parts 6*h* and 6*i* instead of the two extension parts 6*f* and 6*g* linearly extending. The extension parts 6*h* and 6*i* extend and bend outwardly (opposite side to the display region 4 side) from the first and second parts 6*k* and 6*j*. That is, the bank 6 may not linearly extend and may bend outwardly. In this case, the potting material is kept away from the display region 4, and the prevention effect for the entrance of the potting material from the upper side of the display region 4 is enhanced.

In addition, in the fourth embodiment, the bank 6 may be configured to include two extension parts instead of the two extension parts 6f and 6g linearly extending. The extension parts extend and bend inwardly (the display region side). That is, the bank 6 may not linearly extend and may bend inwardly.

<Fifth Modification>

In the second embodiment, in the same manner as the bank 6 of the fourth embodiment, the second bank 201 may be formed to include two extension parts. The extension parts, respectively, linearly extend from the facing parts 201a and 201b to enclose the outer circumferential region of the display region 4 adjacent to the predetermined side (upper side S4).

In addition, in the second embodiment, in the same manner as the bank 6 of the fourth modification, the second bank 201 may be formed to include two extension parts. The respective extension parts, respectively, extend and bend outwardly from the facing parts 201a and 201b to enclose the outer circumferential region of the display region 4 adjacent to the predetermined side (upper side S4).

In the implementation of the present invention, the disclosed forms of the second bank 201 might be applied to the bank 6 as well. In short, the bank 6 might include two extension parts which linearly extending, or which outwardly or inwardly bend.

<Sixth Modification>

The bank in the fourth embodiment and the above-described fourth modification may be implemented in the DM in the second embodiment and the modification thereof. That is, the bank including the extension parts and the second bank may be configured. In the case, the same effects are obtained.

<Seventh Modification>

In the second and third embodiments, it is not necessary for the second bank to be formed with a single bank. One or more additional banks having a configuration corresponding to the above second bank may be provided. That is, the bank configuration that encloses the display region 4 includes a triple or more bank configuration. In the second embodiment, another second bank may further be provided at the position between the dummy LMD protection part 5b and the second bank 201 and separated by a predetermined distance from both of them, for example.

<Eighth Modification>

In the first to fourth embodiments, the LMD protection part 5a and/or the dummy LMD protection part 5b may be omitted.

<Ninth Modification>

In the first to fourth embodiments, a plurality of LMD protection parts may be formed instead of the LMD protection part 5a. The plurality of LMD protection parts are, respectively, positioned on the plurality of light emitting elements 2, and separated into each light emitting element 2. That is, the respective LMD protection parts divided into each of the respective pixels may be formed on the light emitting elements 2 on the respective pixels.

In the case, from the point of prevention of the phenomenon in which the edge parts of the LMD 3 are abnormally illuminated, at least one divided dummy LMD protection part is preferably formed on an outer circumferential region of a region in which the plurality of LMD protection parts are formed. A shape and quality of material of the dummy LMD protection part are preferably same as those of the LMD protection part. In addition, an arrangement interval between the dummy LMD protection part and the LMD protection part and an arrangement interval between the dummy LMD protection parts are preferably same as an arrangement interval between the LMD protection parts. Moreover, the dummy LMD protection part is preferably arranged to enclose all of the plurality of the LMD protection parts. The dummy LMD protection part is arranged to configure a matrix of (m+2·m1) rows and (k+2·k1) columns by the LMD protection part and the dummy LMD protection part when the LMD protection part is arranged in a matrix of "m" rows and "k" columns, for example. Note that m1 and k1 are one or more integer number.

In the modification, the same effects are obtained by the bank. In addition, according to the modification, stresses by the LMD protection part and the dummy LMD protection part are relaxed. In addition, an emitting area per pixel area is widened, and a display module that conveys the impression that the module includes fewer dots is provided in comparison with the case when the LMD protection part and the dummy LMD protection part are not divided.

<Tenth Modification>

In the above-described ninth modification, the LMD protection parts may include microlenses that focus the light emitted by the light emitting elements 2. The plurality of the LMD protection parts may be configured as a microlens array by processing a shape of the LMD protection part on each of the pixels and positioning the LMD protection part on the pixel, for example. In the modification, the same effects are obtained by the bank. In addition, an effect to improve a usage efficiency of light emission is obtained when the microlens array is formed on the light emitting element.

<Eleventh Modification>

In the first to fourth embodiments, the driver IC chip 10 (i.e. drive circuit) may be provided out of the substrate 1. In this case, no driver IC chip 10 on the substrate 1 is provided. The anode wirings and the cathode wirings are connected to the drive circuit provided outside via the flat-type cable, for example. The drive circuit may be provided in the middle of the flat-type cable, and may have a Chip On Film (COF) configuration.

<Twelfth Modification>

In the first to fourth embodiments, the outer circumference protection part 16 needs only be formed outer than the LMD protection part 5a. That is, the potting material needs only not to enter into the LMD protection part 5a. The outer circumference protection part 16 may be formed to fill the trench 7, for example. In addition, in the configuration in which the second bank and the second trench are provided, the outer circumference protection part 16 may be formed to the second trench. In addition, the outer circumference protection part 16 may be formed at the upper side part of the DM (i.e. outer circumferential region of the dummy LMD protection part 5b adjacent to the upper side) unless the potting material enters into the LMD protection part 5a.

<Thirteenth Modification>

In the first to fourth embodiments, the configurations of the DM and/or the manufacturing methods may be altered to methods other than those illustrated in the drawings. The light emitting element may be an EL element formed of an organic-based material, an inorganic-based material, or the like instead of the LED element, for example. In the case, the substantially same functions and effects are obtained as the first to fourth embodiments.

<Fourteenth Modification>

In the above-described description, the configuration in which only one light emitting element 2 (e.g. LED element) is provided on one pixel is illustrated. However, in the first to fourth embodiments, the plurality of light emitting elements 2 (e.g. LED element) connected to each other in tandem in one pixel may be provided. In the case, an applied voltage is high. However, the value of current flowing through cathode wirings is decreased while obtaining the approximately same luminance.

<Fifteenth Embodiment>

The DMs of the first to fourth embodiments are not limited to the fifth to eighth embodiments, and may be used in other embodiments. The DMs may be implemented in a so-called direct-view-type display apparatus that does not use a projection optical system, for example. The direct-view-type display apparatus in which the DMs of the first to fourth embodiments are implemented has a simple and downsized structure since the display apparatus uses the self-luminous type light emitting element array. Free layouts are possible when the apparatus is built in a mobile device, for example.

While the present invention is not limited to the above-described embodiments, it should be apparent that modifications and improvements may be made to the invention without departing from the spirit and scope of the invention as described in the following claims. The configurations of the above-described first to fourth embodiments and the first to fifteenth modifications may be arbitrarily combined other than the above-described combinations, for example.

What is claimed is:

1. A display module, comprising:
   a substrate;
   a plurality of light emitting elements provided on the substrate;
   a bank provided on the substrate at a position separated by a trench from an outer circumferential edge of a display region on which the plurality of light emitting elements are arranged, the bank being configured to enclose at least a part of the outer circumferential edge of the display region, a surface of the trench being recessed; and
   an outer circumference protection part provided on the bank and on an outer circumferential region of the bank, the outer circumference protection part being formed of a resin material.

2. The display module according to claim 1, wherein the display region is substantially rectangular from a plan view,
   the bank includes:
      a first facing part and a second facing part configured to face first and second sides of the displaying region that are opposing from each other, the first and second sides being two of three sides of the display region excluding a predetermined side;
      a third facing part configured to face a third side of the display region that extends between the first and second sides;
      a first linkage part configured to link the first facing part and the third facing part; and
      a second linkage part configured to link the second facing part and the third facing part.

3. The display module according to claim 2, wherein the bank further includes two extension parts configured to, respectively, linearly extend from the first and second facing parts to enclose an outer circumferential region of the display region adjacent to the predetermined side.

4. The display module according to claim 2, wherein the bank is configured to enclose the outer circumferential region of the display region adjacent to the predetermined side, and further includes two extension parts configured to, respectively, extend from the first and second parts and to bend outwardly.

5. The display module according to claim 2, wherein the bank further includes two extension parts configured to, respectively, extend from the first and second parts and to bend inwardly to enclose the outer circumferential region of the display region adjacent to the predetermined side.

6. The display module according to claim 2, wherein the bank is further configured to enclose an entire outer circumferential edge of the display region.

7. The display module according to claim 2, further comprising:
   a second bank provided on the substrate at a position between the display region and the bank and separated by a predetermined distance from both of the display region and the bank, the second bank being configured to enclose three sides of the display region excluding the predetermined side before the sealing, wherein
   the second bank includes:
      a fourth facing part and a fifth facing part configured to face first and second sides of the displaying region that are opposing from each other, the first and second sides being two of three sides of the display region excluding the predetermined side;
      a sixth facing part configured to face a third side of the display region that extends between the first and second sides;
      a third linkage part configured to link the fourth facing part and the sixth facing part; and
      a fourth linkage part configured to link the fifth facing part and the sixth facing part.

8. The display module according to claim 7, wherein the second bank further includes two extension parts configured to, respectively, linearly extend from the fourth and fifth facing parts to enclose an outer circumferential region of the display region adjacent to the predetermined side.

9. The display module according to claim 7, wherein the second bank is configured to enclose the outer circumferential region of the display region adjacent to the predetermined side, and further includes two extension parts configured to, respectively, extend from the fourth and fifth facing parts and to bend outwardly.

10. The display module according to claim 7, wherein the second bank further includes two extension parts configured to, respectively, extend from the fourth and fifth facing parts and to bend inwardly to enclose the outer circumferential region of the display region adjacent to the predetermined side.

11. The display module according to claim 7, wherein the second bank is further configured to enclose an entire outer circumferential edge of the display region.

12. The display module according to claim 1, further comprising:
   a second bank provided on the substrate at a position between the display region and the bank and separated by a predetermined distance from both of the display region and the bank, the second bank being configured to enclose at least a part of the outer circumferential edge of the display region before the sealing.

13. The display module according to claim 12, wherein:
   the second bank is configured with more than two banks.

14. The display module according to claim 1, wherein the display region is substantially rectangular from a plan view, a second bank is provided on the substrate at a position between the display region and the bank and separated by a predetermined distance from both of the display region and the bank, the second bank being configured to enclose at least a part of the outer circumferential edge of the display region, at least one of the bank and the second bank includes at least:

two facing parts configured to face two sides of the display region that are adjacent to the facing parts; and a linkage part configured to link the two facing parts, the linkage part formed to smoothly link the two facing parts.

15. The display module according to claim 1, further comprising:

a protection part provided on the display region.

16. The display module according to claim 15, wherein the protection part extends to an outer circumferential region of the display region.

17. The display module according to claim 1, further comprising:

a plurality of protection parts, respectively, positioned on the plurality of light emitting elements and separated into each light emitting element.

18. The display module according to claim 17, wherein the plurality of protection parts comprises microlenses configured to focus light emitted by respective light emitting elements corresponding to the protection parts.

19. The display module according to claim 17, further comprising:

at least one protection part divided on an outer circumferential region of a region in which the plurality of protection parts are formed.

20. The display module according to claim 1, further comprising:

a drive circuit provided on the substrate, the drive circuit being configured to selectively drive each of the light emitting elements and a cable configured to connect the drive circuit to an external control circuit.

21. The display module according to claim 1, further comprising:

a cable configured to connect each of the light emitting elements and a drive circuit provided outside and configured to selectively drive each of the light emitting elements on the substrate.

22. A projection type display apparatus, comprising:

a display module; and an optical system configured to project light emitted by the display module on a predetermined place to display an image on the predetermined place, wherein the display module includes:

a substrate;

a plurality of light emitting elements provided on the substrate;

a bank provided on the substrate at a position separated by a trench from an outer circumferential edge of a display region on which the plurality of light emitting elements are arranged, the bank being configured to enclose at least a part of the outer circumferential edge of the display region, a surface of the trench being recessed; and an outer circumference protection part provided on the bank and on an outer circumferential region of the bank, the outer circumference protection part being formed of a resin material.

23. A direct-view-type display apparatus, comprising:

a display module, wherein the display module includes:

a substrate;

a plurality of light emitting elements provided on the substrate;

a bank provided on the substrate at a position separated by a trench from an outer circumferential edge of a display region on which the plurality of light emitting elements are arranged, the bank being configured to enclose at least a part of the outer circumferential edge of the display region, a surface of the trench being recessed; and an outer circumference protection part provided on the bank and on an outer circumferential region of the bank, the outer circumference protection part being formed of a resin material.

24. A display module, comprising:

a substrate;

a plurality of light emitting elements provided on the substrate;

a bank provided on the substrate at a position separated from an outer circumferential edge of a display region on which the plurality of light emitting elements are arranged with a space formed between the bank and the outer circumferential edge of the display region, the bank being configured to enclose at least a part of the outer circumferential edge of the display region; and an outer circumference protection part provided on the bank and on an outer circumferential region of the bank, the outer circumference protection part being formed of a resin material, wherein an outer side of the outer circumference protection part that is opposite from an inner side, on which the bank is provided, is exposed to an outside of the display module.

* * * * *